US008081002B2

(12) United States Patent
Wahlroos et al.

(10) Patent No.: US 8,081,002 B2
(45) Date of Patent: Dec. 20, 2011

(54) APPARATUS AND METHOD FOR DETERMINING LOCATION OF PHASE-TO-PHASE FAULT OR THREE-PHASE FAULT

(75) Inventors: Ari Wahlroos, Vaasa (FI); Janne Altonen, Toijala (FI)

(73) Assignee: ABB Technology AG, Zurich (CH)

( * ) Notice: Subject to any disclaimer, the term of this patent is extended or adjusted under 35 U.S.C. 154(b) by 168 days.

(21) Appl. No.: 12/421,171

(22) Filed: Apr. 9, 2009

(65) Prior Publication Data

US 2009/0267611 A1 Oct. 29, 2009

(30) Foreign Application Priority Data

Apr. 29, 2008 (EP) ..................................... 08155321

(51) Int. Cl.
*G01R 31/08* (2006.01)
(52) U.S. Cl. ....................................... 324/522; 324/512
(58) Field of Classification Search .................. 324/509, 324/512, 521, 522, 525; 361/44, 47, 48, 361/78–87; 702/58, 59
See application file for complete search history.

(56) References Cited

U.S. PATENT DOCUMENTS

| 5,428,549 | A | * | 6/1995 | Chen ................................ 702/59 |
| 5,661,664 | A | * | 8/1997 | Novosel et al. ................ 700/293 |
| 5,773,980 | A | * | 6/1998 | Yang ................................ 324/525 |
| 5,839,093 | A | * | 11/1998 | Novosel et al. ................. 702/59 |
| 6,420,876 | B1 | | 7/2002 | Saha et al. |
| 6,466,031 | B1 | * | 10/2002 | Hu et al. ......................... 324/522 |
| 6,661,630 | B1 | * | 12/2003 | Ahn ................................. 361/80 |
| 7,660,088 | B2 | * | 2/2010 | Mooney et al. .................. 361/63 |
| 2006/0097728 | A1 | * | 5/2006 | Saha et al. ..................... 324/525 |
| 2007/0014059 | A1 | | 1/2007 | Altonen et al. |
| 2007/0070565 | A1 | * | 3/2007 | Benmouyal et al. ............ 361/62 |
| 2007/0156358 | A1 | * | 7/2007 | Saha et al. ...................... 702/59 |

FOREIGN PATENT DOCUMENTS

EP 1724597 A2 * 11/2006

(Continued)

OTHER PUBLICATIONS

Das et al., A Fault Locator for Radial Subtransmission and Distribution Lines, Power Engineering Society Summer Meeting, 2000.*

(Continued)

*Primary Examiner* — Melissa Koval
*Assistant Examiner* — Daniel Miller
(74) *Attorney, Agent, or Firm* — Buchanan Ingersoll & Rooney PC

(57) ABSTRACT

A method and apparatus for determining a distance of a phase-to-phase fault or a three-phase fault on a three-phase electric line, the apparatus (40) being configured to determine a first estimate value for a distance between the measuring point (40) and a point (F) of fault on the basis of a first equation based on a fault loop model in which the point of fault is located between the measuring point and load of the electric line, and a second estimate value for the distance on the basis of a second equation based on a fault loop model in which the load of the electric line is located between the measuring point and the point of fault, and to select according to predetermined criteria one of the determined two estimate values as the distance between the measuring point (40) and the point of fault (F).

19 Claims, 6 Drawing Sheets

FOREIGN PATENT DOCUMENTS

| EP | 1 739 441 A1 | | 1/2007 |
|---|---|---|---|
| WO | WO/2007/032697 | * | 3/2007 |
| WO | WO 2007/032697 A1 | | 3/2007 |
| WO | WO/2007/079990 | * | 7/2007 |
| WO | WO/2007/090484 | * | 8/2007 |

OTHER PUBLICATIONS

Sachdev et al., Determining Locations of Faults in Distribution Systems, Developments in Power System Protection, Sixth International Conference, 1997.*

Network Protection & Automation Guide, Chapter 4, Fault Calculations, First Edition, Jul. 2002.*

Izykowski et al., A Fault-Location Method for Application With Current Differential Relays of Three-Terminal Lines, IEEE Transactions on Power Delivery, 2007.*

IEEE Guide for Determining Fault Location on AC Transmission and Distribution Lines, IEEE Std C37.114-2004, 2005.*

Majstrovic et al., Influence of Earthing Conductors on Current Reduction Factor of a Distribution Cable Laid in High Resistivity Soil, 2001 IEEE Porto Power Tech Conference, 2001.*

Das, Ratan "Determining the Locatiaons of Faults in Distribution Systems." Spring 1998. http://library2.usask.ca/theses/available/etd-10212004-001150/.*

European Search Report for EP 08155321.6 completed Aug. 29, 2008.

Karl Zimmerman et al., Impedance-Based Fault Location Experience, 2004, pp. 1-27, Schweitzer Engineering Laboratories, Inc., Pullman, USA.

M S Sachdev, Determining Locations of Faults in Distribution Systems, Developments in Power Protection, IEE Mar. 25-27, 1997, pp. 188-191, No. 424.

Das, Ratan "Determining the Locatiaons of Faults in Distribution Systems." Spring 1998. http://library2.usask.ca/theses/available/etd-10212004-001150/.

* cited by examiner a)

b)

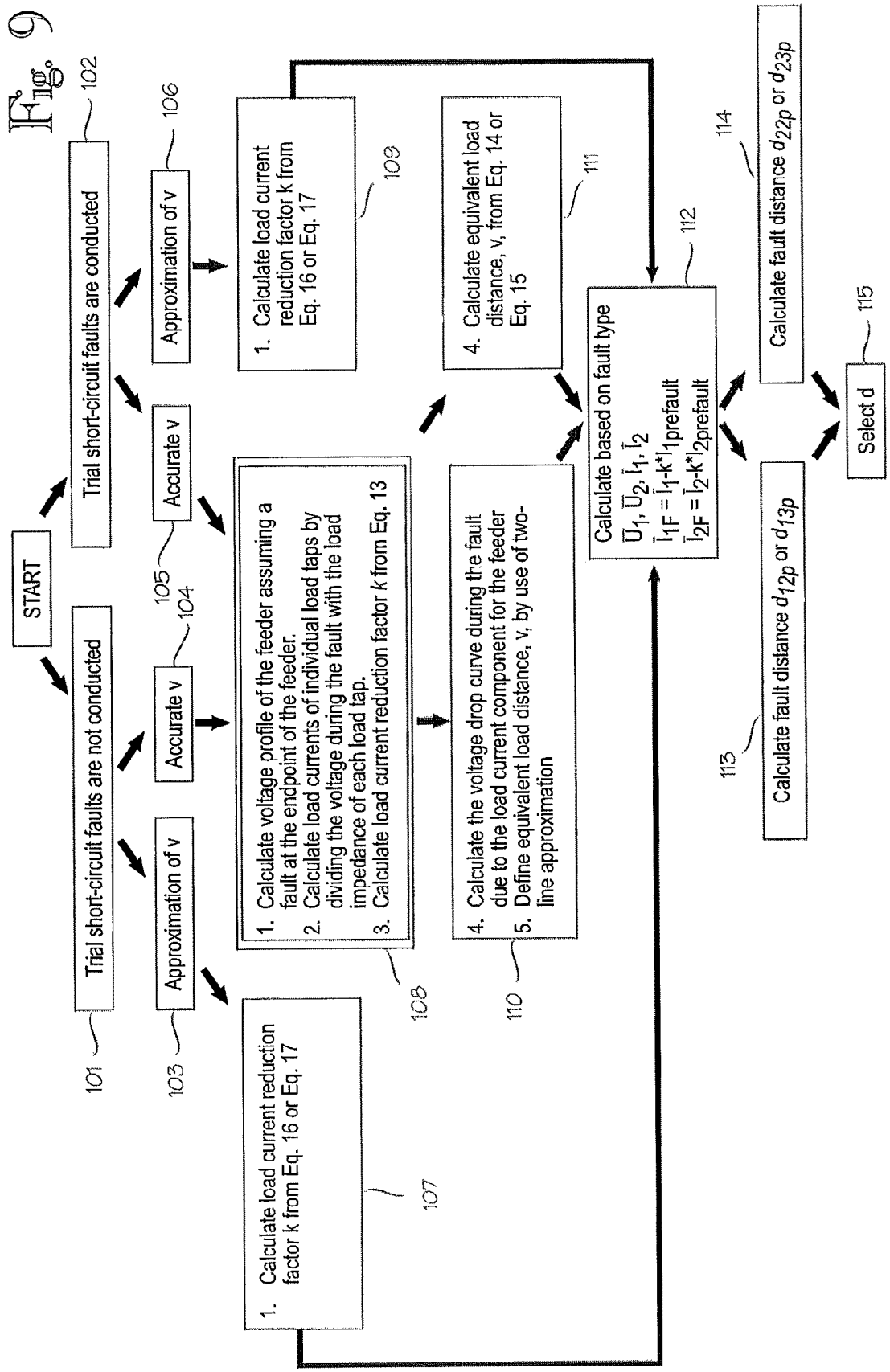

APPARATUS AND METHOD FOR DETERMINING LOCATION OF PHASE-TO-PHASE FAULT OR THREE-PHASE FAULT

FIELD OF THE INVENTION

The present invention relates to localization of a phase-to-phase or three-phase faults in electric networks.

BACKGROUND OF THE INVENTION

Impedance-based fault location algorithms have become an industry standard in modern microprocessor based protection relays. The reason for their popularity is their easy implementation as they utilize the same signals as other functions. Their performance has proven to be quite satisfactory in localizing short-circuit faults in transmission lines. Nowadays impedance-based fault location is becoming an increasingly common feature also in distribution voltage level relays. Distribution networks, however, have specific features which further complicate and challenge fault localization algorithms. These include e.g. presence of laterals and load taps, which deteriorate fault location accuracy.

One important factor affecting the accuracy of impedance-based fault localization algorithms is the combined effect of load current and fault resistance. A majority of prior art fault localization algorithms try to eliminate the load component from measured currents. The most commonly implemented fault location algorithms are based on the so-called Takagi method [see e.g. document Impedance-based Fault Location Experience, Karl Zimmerman and David Costello, Schweitzer Engineering Laboratories, Inc., USA]. Takagi method uses delta quantities (fault state value minus healthy state value) for load compensation. The algorithm further assumes that the load is tapped to the end point of the electric line (e.g. a feeder); i.e. the fault is always located in front of the load point. This may be an adequate assumption in high-voltage transmission lines, but in real medium voltage feeders this assumption is rarely correct. In fact, due to voltage drop considerations, loads are typically located either at the beginning of the feeder or distributed more or less randomly over the entire feeder length. In such cases, the accuracy of prior art fault localization algorithms is deteriorated.

BRIEF DESCRIPTION OF THE INVENTION

An object of the present invention is thus to provide a method and an apparatus for implementing the method so as to overcome the above problem or at least to alleviate it. The objects of the invention are achieved by a method, a computer program product, and an apparatus which are characterized by what is stated in the independent claims. The preferred embodiments of the invention are disclosed in the dependent claims.

The invention is based on the idea of determining two possible fault location alternatives; one on the basis of a fault loop model in which the point of fault is located between a measuring point and a load of the electric line, and another on the basis of a fault loop model in which the load of the electric line is located between the measuring point and the point of fault. Furthermore, voltage and current quantities in fault loop model equations are preferably optimally selected for fault localization purposes.

An advantage of the method and arrangement of the invention is that the accuracy of phase-to-phase and three-phase fault localization can be improved. The present invention is applicable in all types of electric networks.

BRIEF DESCRIPTION OF THE DRAWINGS

In the following the invention will be described in greater detail by means of preferred embodiments with reference to the accompanying drawings, in which

FIG. 9 is a flow diagram for determining a distance of a phase-to-phase fault or a three-phase fault according to an embodiment.

DETAILED DESCRIPTION OF THE INVENTION

The application of the invention is not limited to any specific system, but it can be used in connection with various three-phase electric systems to determine a location of a phase-to-phase fault or a three-phase fault on a three-phase electric line. The electric line can be a feeder, for example, and may be an overhead-line or a cable or a combination of both. The electric power system in which the invention is implemented can be an electric transmission or distribution network or a component thereof, for example, and may comprise several feeders or sections. Moreover, the use of the invention is not limited to systems employing 50 Hz or 60 Hz fundamental frequencies or to any specific voltage level.

Figure 1:
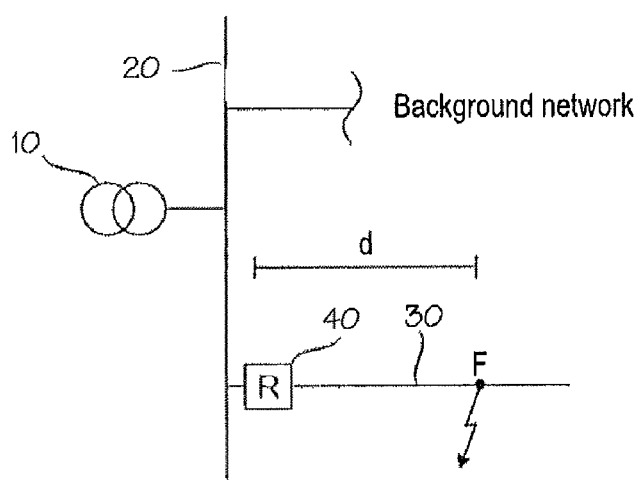
FIG. 1 is a diagram illustrating an electric network in which the invention can be used.

FIG. 1 is a simplified diagram illustrating an electric network in which the invention can be applied. The figure shows only the components necessary for understanding the invention. The exemplary network can be a medium voltage (e.g. 20 kV) distribution network fed through a substation comprising a transformer 10 and a busbar 20. The illustrated network also comprises electric line outlets, i.e. feeders, of which one 30 is shown separately. Other possible feeders as well as other network parts, except the line 30, are referred to as a 'background network'. The figure also shows a protective relay unit 40 at the beginning of line 30, and a point of earth fault F. The protective relay unit 40 may be located inside the substation. It should be noted that there may be any number of feeders or other network elements in the network. There may also be several feeding substations. Further, the invention can be utilized with a switching station without a transformer 10, for example. The network is a three-phase network, although, for the sake of clarity, the phases are not shown in the figure. In the exemplary system of FIG. 1, the functionality of the invention is preferably located in the relay unit 40. It is also possible that only some measurements are performed at the location of unit 40 and the results are then transmitted to another unit or units in another location for further processing. In other words, the relay unit 40 could be a mere measuring unit, while the functionality of the invention, or part of it, could be located in another unit or units.

In the following, the three phases of the three-phase electricity system in which the invention is used are referred to as L1, L2, and L3. Monitored current and voltage values are preferably obtained by a suitable measuring arrangement including e.g. current and voltage transducers (not shown in the figures) connected to the phases of the electricity system. In most of the existing protection systems, these values are readily available and thus the implementation of the invention does not necessarily require any separate measuring arrangements. How these values are obtained is of no relevance to the basic idea of the invention and depends on the particular electricity system to be monitored. A three-phase fault or a phase-to-phase fault F occurring on the three-phase electric line 30 and the corresponding faulted phases L1, L2, and/or L3 of the three-phase electric line of the electricity system to be monitored may be detected e.g. by a protective relay 40 associated with the electricity system. The particular way how such faults are detected and corresponding faulted phases are identified is of no relevance to the basic idea of the invention.

In the following reference is made to FIG. 9 illustrating a flow diagram for determining a distance of a phase-to-phase fault or three-phase fault according to an embodiment. The invention is not, however, limited to the examples shown. For example, one or more steps may be omitted or modified. Moreover, steps may be performed in an order different from the one shown in the example. Thus, FIG. 9 merely illustrates some possible embodiments.

According to an embodiment, two alternative fault distance estimates are determined (steps 113 and 114) from a measuring point (e.g. relay location 40) to a fault point F, in which a phase-to-phase fault or three-phase fault occurs, using fundamental frequency voltage and current signals and two alternative fault loop models. The models preferably differ from each other as to how the loading of the electric line is taken into account: one alternative model assumes that fault is located in front of the load tap and an alternative model that the fault is located behind the load tap. One of the determined estimate values is then selected, according to predetermined criteria, as the distance between the measuring point and the point of fault. In the following some possible ways of determining the alternative fault distance estimates are given. However, it should be noted that the invention is not limited to the given exemplary equations or combinations thereof.

Figure 2:
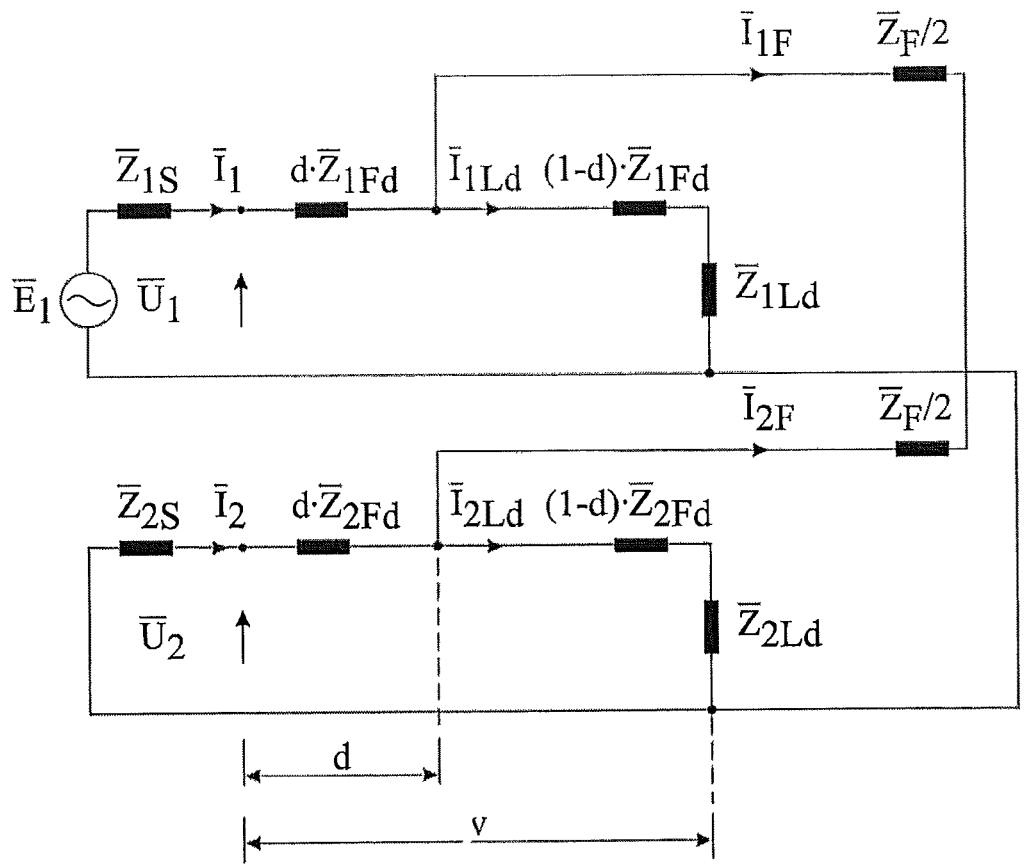
FIG. 2 is a symmetrical component equivalent scheme for a) phase-to-phase fault and b) three-phase fault in an electric line.
Figure 2:
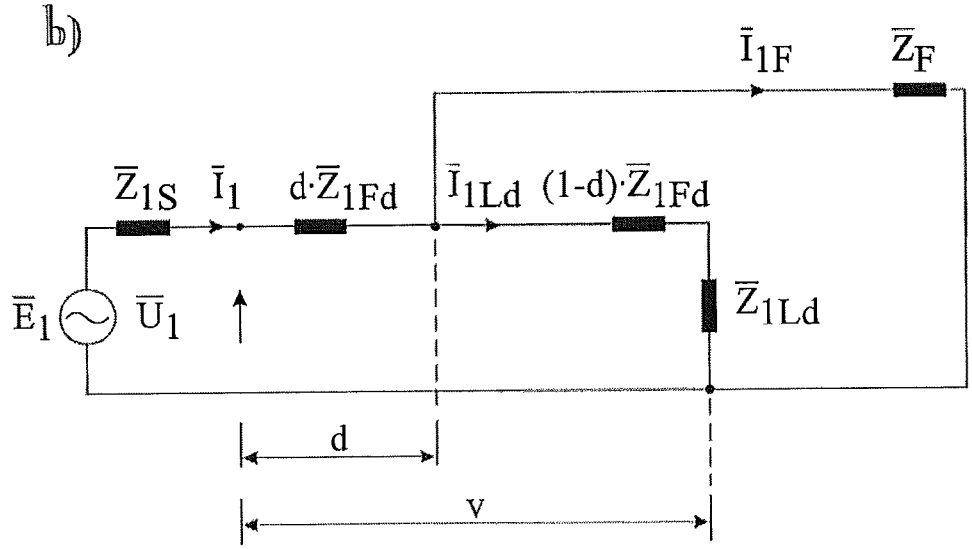

According to an embodiment, a first estimate value for the distance between the measuring point and a point of fault is determined (step 113) on the basis of a first equation which is based on a fault loop model of the electric line, in which model the point of fault is located between the measuring point and the load of the electric line. FIG. 2 shows a symmetrical component equivalent scheme for a) a phase-to-phase fault and b) a three-phase fault in an electric line in which the fault point is assumed to be in front of the load tap.

Figure 3:
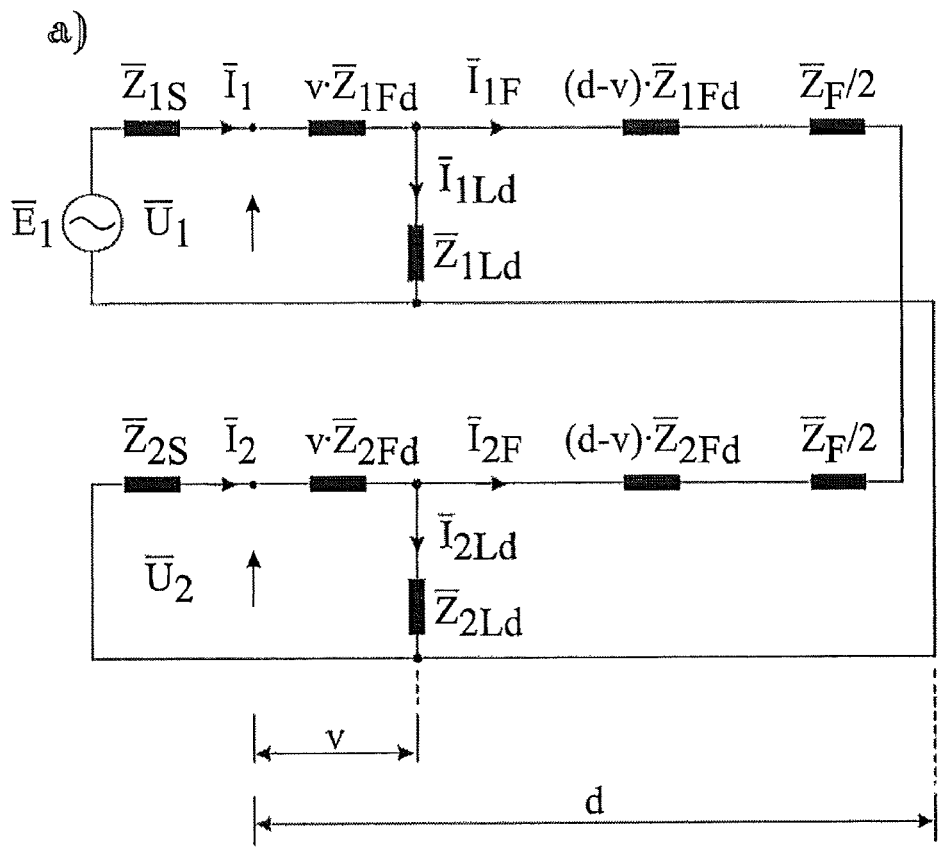
FIG. 3 is a symmetrical component equivalent scheme for a) phase-to-phase fault and b) three-phase fault in an electric line.
Figure 3:
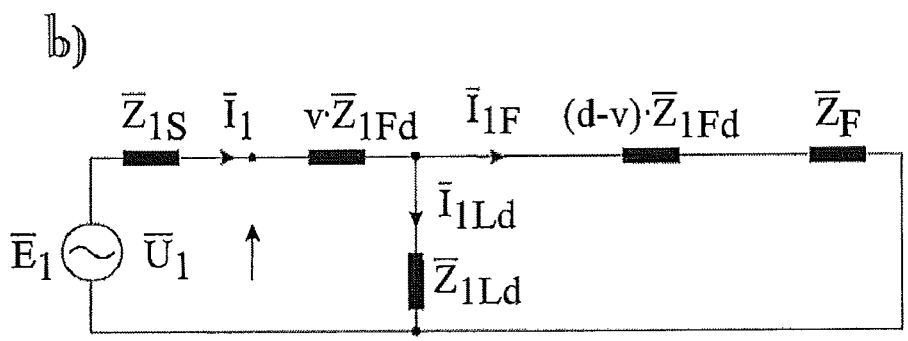

Notations used in FIGS. 2 and 3:
$\overline{Z}_{1S}$=Positive sequence source impedance
d=per unit fault distance (d=0 . . . 1)
$\overline{Z}_{1Fd}$=Positive sequence impedance of the electric line per phase
$\overline{Z}_{1Ld}$=Positive sequence impedance of the load per phase
$\overline{Z}_{2S}$=Negative sequence source impedance
$\overline{Z}_{2Fd}$=Negative sequence impedance of the electric line per phase
$\overline{Z}_{2Ld}$=Negative sequence impedance of the load per phase $\overline{Z}_F$=Fault impedance. In case of phase-to-phase fault, this is the fault impedance between phases. In case of a three-phase fault this is the fault impedance per phase.
$\overline{I}_1$=Positive sequence component current measured at the measuring point
$\overline{I}_{1F}$=Positive sequence fault component current at the fault point
$\overline{I}_{1Ld}$=Positive sequence component load current
$\overline{I}_F$=Fault component current at fault point
$\overline{I}_2$=Negative sequence component current measured at the measuring point
$\overline{I}_{2F}$=Negative sequence fault component current at the fault point
$\overline{I}_{2Ld}$=Negative sequence component load current
$\overline{U}_1$=Positive sequence component voltage measured at the measuring point
$\overline{U}_2$=Negative sequence component voltage measured at the measuring point
v=per unit distance of equivalent load.

Based on the equivalent schemes illustrated in FIG. 2 the following equations can be written:

For a phase-to-phase fault:

$$\overline{U}_1 - \overline{U}_2 = d*\overline{Z}_{1Fd}*\overline{I}_1 + \overline{Z}_F/2*\overline{I}_{1F} - d*\overline{Z}_{2Fd}*\overline{I}_2 - \overline{Z}_F/2*\overline{I}_{2F} \quad \text{(Eq. 1)}$$

For a three-phase fault:

$$\overline{U}_1 = d*\overline{Z}_{1Fd}*\overline{I}_1 + \overline{Z}_F*\overline{I}_{1F} \quad \text{(Eq. 2)}$$

For conductors applies $\overline{Z}_2 = \overline{Z}_1$. A commonly accepted assumption is that the fault impedance is purely resistive, i.e. $\overline{Z}_F = R_F + jX_F = R_F$. Otherwise, the ratio of settings $X_F/R_F$ should be known. In the following it is assumed that $\overline{Z}_F = R_F$. Unknowns d and $R_F$ can be solved from Eq. 1 or Eq. 2 by dividing them into real and imaginary components.

Fault distance d in case of a phase-to-phase fault (denoted as $d_{12p}$) can be solved from Eq. 1:

$$d_{12p} = -1/(\text{re}(\overline{I}_{1F})*\text{im}(\overline{Z}_{1Fd}*\overline{I}_1) - \text{re}(\overline{I}_{1F})*\text{im}(\overline{Z}_{2Fd}*\overline{I}_2) -$$

$$\text{re}(\overline{I}_{2F})*\text{im}(\overline{Z}_{1Fd}*\overline{I}_1) + \text{re}(\overline{I}_{2F})*\text{im}(\overline{Z}_{2Fd}*\overline{I}_2) -$$

$$\text{im}(\overline{I}_{1F})*\text{re}(\overline{Z}_{1Fd}*\overline{I}_1) + \text{im}(\overline{I}_{1F})*\text{re}(\overline{Z}_{2Fd}*\overline{I}_2) + \text{im}(\overline{I}_{2F})*\text{re}(\overline{Z}_{1Fd}*\overline{I}_1) -$$

$$\text{im}(\overline{I}_{2F})*\text{re}(\overline{Z}_{2Fd}*\overline{I}_2))*(-\text{re}(\overline{I}_{1F})*\text{im}(\overline{U}_1) + \text{re}(\overline{I}_{1F})*\text{im}(\overline{U}_2) + \text{im}(\overline{I}_{2F})*\text{re}(\overline{U}_2) -$$

$$\text{im}(\overline{I}_{1F})*\text{re}(\overline{U}_2) + \text{re}(\overline{I}_{2F})*\text{im}(\overline{U}_1) - \text{re}(\overline{I}_{2F})*\text{im}(\overline{U}_2) + \text{im}(\overline{I}_{1F})*\text{re}(\overline{U}_1) - \text{im}(\overline{I}_{2F})*\text{re}(\overline{U}_1)) \quad \text{(Eq. 3)}$$

where
re=real part. For example re($\overline{I}_{1F}$) refers to the real part of phasor $\overline{I}_{1F}$ and re($\overline{Z}_{1Fd}*\overline{I}_1$) refers to the real part of the product of phasors $\overline{Z}_{1Fd}$ and $\overline{I}_1$.

im=imaginary part. For example im($\overline{I}_{1F}$) refers to the imaginary part of phasor $\overline{I}_{1F}$ and im($\overline{Z}_{1Fd}*\overline{I}_1$) refers to the imaginary part of the product of phasors $\overline{Z}_{1Fd}$ and $\overline{I}_1$.

Fault distance d in case of a three-phase fault (denoted as $d_{13p}$) can be solved from Eq. 2:

$$d_{13p} = -1/(\text{re}(\overline{I}_{1F})*\text{im}(\overline{Z}_{1Fd}*\overline{I}_1) - \text{im}(\overline{I}_{1F})*\text{re}(\overline{Z}_{1Fd}*\overline{I}_1))*(-\text{re}(\overline{I}_{1F})*\text{im}(\overline{U}_1) +$$

$$\text{im}(\overline{I}_{1F})*\text{re}(\overline{U}_1)) \quad \text{(Eq. 4)}$$

A valid estimate value for fault distance $d_{12p}$ and $d_{13p}$ is preferably such that 0<d<1 (in practice some error margin may be needed).

The solution of $R_F$ (fault impedance is assumed to be purely resistive, i.e. $\overline{Z}_F = R_F + jX_F = R_F$) in case of a phase-to-phase fault can be derived from Eq. 1:

$$R_{F12p}=2*(-\text{re}(\overline{U}_2)*\text{im}(\overline{Z}_{1Fd}*\overline{I}_1)-$$

$$\text{re}(\overline{Z}_{1Fd}*\overline{I}_1)*\text{im}(\overline{U}_1)+\text{re}(\overline{Z}_{1Fd}*\overline{I}_1)*\text{im}(\overline{U}_2)+\text{re}(\overline{Z}_{2Fd}*\overline{I}_2)*\text{im}(\overline{U}_1)-$$

$$\text{re}(\overline{Z}_{2Fd}*\overline{I}_2)*\text{im}(\overline{U}_2)+\text{re}(\overline{U}_1)*\text{im}(\overline{Z}_{1Fd}*\overline{I}_1)-$$

$$\text{re}(\overline{U}_1)*\text{im}(\overline{Z}_{2Fd}*\overline{I}_2)+\text{re}(\overline{U}_2)*\text{im}(\overline{Z}_{2Fd}*\overline{I}_2))/(\text{re}(\overline{I}_{1F})*\text{im}(\overline{Z}_{1Fd}*\overline{I}_1)-$$

$$\text{re}(\overline{I}_{1F})*\text{im}(\overline{Z}_{2Fd}*\overline{I}_2)-\text{re}(\overline{I}_{2F})*\text{im}(\overline{Z}_{1Fd}*\overline{I}_1)+\text{re}(\overline{I}_{2F})*\text{im}(\overline{Z}_{2Fd}*\overline{I}_2)-$$

$$\text{im}(\overline{I}_{1F})*\text{re}(\overline{Z}_{1Fd}*\overline{I}_1)+\text{im}(\overline{I}_{1F})*\text{re}(\overline{Z}_{2Fd}*\overline{I}_2)+\text{im}(\overline{I}_{2F})*\text{re}(\overline{Z}_{1Fd}*\overline{I}_1)-$$

$$\text{im}(\overline{I}_{2F})*\text{re}(\overline{Z}_{2Fd}*\overline{I}_2))\quad\text{(Eq. 5)}$$

The solution of $R_F$ (fault impedance is assumed to be purely resistive, i.e. $\overline{Z}_F=R_F+jX_F=R_F$) in case of a three-phase fault can be derived from Eq. 2:

$$R_{F13p}=(\text{re}(\overline{U}_1)*\text{im}(\overline{Z}_{1Fd}*\overline{I}_1)-\text{re}(\overline{Z}_{1Fd}*\overline{I}_1)*\text{im}(\overline{U}_1))/(\text{re}(\overline{I}_{1F})*\text{im}(\overline{Z}_{1Fd}*\overline{I}_1)-$$

$$\text{im}(\overline{I}_{1F})*\text{re}(\overline{Z}_{1Fd}*\overline{I}_1))\quad\text{(Eq. 6)}$$

According to an embodiment of the invention, a second estimate value for the distance between the measuring point and a point of fault is determined (step 114) on the basis of a second equation based on a fault loop model of the electric line, in which the load of the electric line is located between the measuring point and the point of fault. FIG. 3 shows a symmetrical component equivalent scheme for a) a phase-to-phase fault and b) a three-phase fault in an electric line in which the fault point is assumed to be behind the load tap. Based on equivalent scheme illustrated in FIG. 3, the following equations can be written:

For a phase-to-phase fault:

$$\overline{U}_1-\overline{U}_2=v*\overline{Z}_{1Fd}*\overline{I}_1+(d-v)*\overline{Z}_{1Fd}*\overline{I}_{1F}+\overline{Z}_F/2*\overline{I}_{1F}$$

$$-v*\overline{Z}_{2Fd}*\overline{I}_2-(d-v)*\overline{Z}_{2Fd}*\overline{I}_{2F}-\overline{Z}_F/2*\overline{I}_{2F}\quad\text{(Eq. 7)}$$

For a three-phase fault:

$$\overline{U}_1=v*\overline{Z}_{1Fd}*\overline{I}_1+(d-v)*\overline{Z}_{1Fd}*\overline{I}_{1F}+\overline{Z}_F*\overline{I}_{1F}\quad\text{(Eq. 8)}$$

For conductors applies $\overline{Z}_2=\overline{Z}_1$. A commonly accepted assumption is that the fault impedance is purely resistive, i.e. $\overline{Z}_F=R_F+jX_F=R_F$. Otherwise, the ratio of settings $X_F/R_F$ should be known. In the following it is assumed that $\overline{Z}_F=R_F$. Unknowns d and $R_F$ can be solved from Eq. 7 and Eq. 8 by use of real and imaginary components.

Fault distance d in case of a phase-to-phase fault (denoted as $d_{22p}$) can be solved from Eq. 7:

$$d_{22p}=(\text{re}(\overline{I}_{2F})*v*\text{im}(\overline{Z}_{2Fd}*\overline{I}_2)-\text{im}(\overline{I}_{2F})*\text{re}(\overline{U}_1)+\text{im}(\overline{I}_{2F})*\text{re}(\overline{U}_2)-$$

$$\text{re}(\overline{I}_{1F})*\text{im}(\overline{Z}_{1Fd}*\overline{I}_{1F})*v+\text{re}(\overline{I}_{2F})*\text{im}(\overline{Z}_{1Fd}*\overline{I}_{1F})*v-\text{im}(\overline{I}_{1F})*v*\text{re}(\overline{Z}_{1Fd}*\overline{I}_1)-$$

$$\text{re}(\overline{I}_{1F})*\text{im}(\overline{U}_1)+\text{re}(\overline{I}_{1F})*\text{im}(\overline{U}_2)+\text{re}(\overline{I}_{2F})*\text{im}(\overline{U}_1)-\text{re}(\overline{I}_{2F})*\text{im}(\overline{U}_2)+\text{im}(\overline{I}_{1F})*\text{re}(\overline{U}_1)-$$

$$\text{im}(\overline{I}_{1F})*\text{re}(\overline{U}_2)-\text{re}(\overline{I}_{2F})*v*\text{im}(\overline{Z}_{1Fd}*\overline{I}_1)-$$

$$\text{re}(\overline{I}_{1F})*v*\text{im}(\overline{Z}_{2Fd}*\overline{I}_2)+\text{im}(\overline{I}_{2F})*v*\text{re}(\overline{Z}_{1Fd}*\overline{I}_1)+\text{re}(\overline{I}_{1F})*\text{im}(\overline{Z}_{2Fd}*\overline{I}_{2F})*v-$$

$$\text{im}(\overline{I}_{1F})*\text{re}(\overline{Z}_{2Fd}*\overline{I}_{2F})*v+\text{im}(\overline{I}_{2F})*\text{re}(\overline{Z}_{2Fd}*\overline{I}_{2F})*v+\text{re}(\overline{I}_{1F})*v*\text{im}(\overline{Z}_{1Fd}*\overline{I}_1)-$$

$$\text{re}(\overline{I}_{2F})*\text{im}(\overline{Z}_{2Fd}*\overline{I}_{2F})*v-\text{im}(\overline{I}_{2F})*\text{re}(\overline{Z}_{1Fd}*\overline{I}_{1F})*v-$$

$$\text{im}(\overline{I}_{2F})*v*\text{re}(\overline{Z}_{2Fd}*\overline{I}_2)+\text{im}(\overline{I}_{1F})*\text{re}(\overline{Z}_{1Fd}*\overline{I}_{1F})*v+\text{im}(\overline{I}_{1F})*v*\text{re}(\overline{Z}_{2Fd}*\overline{I}_2))/(-$$

$$\text{im}(\overline{I}_{1F})*\text{re}(\overline{Z}_{2Fd}*\overline{I}_{2F})+\text{re}(\overline{I}_{2F})*\text{im}(\overline{Z}_{1Fd}*\overline{I}_{1F})+\text{im}(\overline{I}_{1F})*\text{re}(\overline{Z}_{1Fd}*\overline{I}_{1F})+$$

$$\text{re}(\overline{I}_{1F})*\text{im}(\overline{Z}_{2Fd}*\overline{I}_{2F})-\text{im}(\overline{I}_{2F})*\text{re}(\overline{Z}_{1Fd}*\overline{I}_{1F})-$$

$$\text{re}(\overline{I}_{1F})*\text{im}(\overline{Z}_{1Fd}*\overline{I}_{1F})+\text{im}(\overline{I}_{2F})*\text{re}(\overline{Z}_{2Fd}*\overline{I}_{2F})-\text{re}(\overline{I}_{2F})*\text{im}(\overline{Z}_{2Fd}*\overline{I}_{2F}))\quad\text{(Eq. 9)}$$

Fault distance d in case of a three-phase fault (denoted as $d_{23p}$) can be solved from Eq. 8:

$$d_{23p}=(\text{im}(\overline{I}_{1F})*\text{re}(\overline{U}_1)-\text{im}(\overline{I}_{1F})*v*\text{re}(\overline{Z}_{1Fd}*\overline{I}_1)+\text{im}(\overline{I}_{1F})*\text{re}(\overline{Z}_{1Fd}*\overline{I}_{1F})*v-$$

$$\text{re}(\overline{I}_{1F})*\text{im}(\overline{U}_1)+\text{re}(\overline{I}_{1F})*v*\text{im}(\overline{Z}_{1Fd}*\overline{I}_1)-$$

$$\text{re}(\overline{I}_{1F})*\text{im}(\overline{Z}_{1Fd}*\overline{I}_{1F})*v)/(\text{im}(\overline{I}_{1F})*\text{re}(\overline{Z}_{1Fd}*\overline{I}_{1F})-\text{re}(\overline{I}_{1F})*\text{im}(\overline{Z}_{1Fd}*\overline{I}_{1F}))\quad\text{(Eq. 10)}$$

A valid estimate value for fault distance $d_{22p}$ and $d_{23p}$ is preferably such that $0<d<1$ (in practice some error margin may be needed).

The solution of $R_F$ (fault impedance is assumed to be purely resistive, i.e. $\overline{Z}_F=R_F+jX_F=R_F$) in case of a phase-to-phase fault can be derived from Eq. 7:

$$R_{F22p}=-2*(v*\text{re}(\overline{Z}_{2Fd}*\overline{I}_2)*\text{im}(\overline{Z}_{1Fd}*\overline{I}_{1F})+v*\text{re}(\overline{Z}_{1Fd}*\overline{I}_1)*\text{im}(\overline{Z}_{2Fd}*\overline{I}_{2F})+$$

$$\text{re}(\overline{Z}_{1Fd}*\overline{I}_{1F})*v*\text{im}(\overline{Z}_{1Fd}*\overline{I}_1)-\text{re}(\overline{Z}_{1Fd}*\overline{I}_{1F})*\text{im}(\overline{U}_1)+\text{re}(\overline{U}_2)*\text{im}(\overline{Z}_{2Fd}*\overline{I}_{2F})-$$

$$\text{re}(\overline{U}_2)*\text{im}(\overline{Z}_{1Fd}*\overline{I}_{1F})-\text{re}(\overline{Z}_{1Fd}*\overline{I}_{1F})*v*\text{im}(\overline{Z}_{2Fd}*\overline{I}_2)-$$

$$\text{re}(\overline{U}_1)*\text{im}(\overline{Z}_{2Fd}*\overline{I}_{2F})+\text{re}(\overline{U}_1)*\text{im}(\overline{Z}_{1Fd}*\overline{I}_{1F})-v*\text{re}(\overline{Z}_{1Fd}*\overline{I}_1)*\text{im}(\overline{Z}_{1Fd}*\overline{I}_{1F})-$$

$$v*\text{re}(\overline{Z}_{2Fd}*\overline{I}_2)*\text{im}(\overline{Z}_{2Fd}*\overline{I}_{2F})-$$

$$\text{re}(\overline{Z}_{2Fd}*\overline{I}_{2F})*v*\text{im}(\overline{Z}_{1Fd}*\overline{I}_1)+\text{re}(\overline{Z}_{2Fd}*\overline{I}_{2F})*v*\text{im}(\overline{Z}_{2Fd}*\overline{I}_2)+\text{re}(\overline{Z}_{1Fd}*\overline{I}_{1F})*\text{im}(\overline{U}_2)-$$

$$\text{re}(\overline{Z}_{2Fd}*\overline{I}_{2F})*\text{im}(\overline{U}_2)+\text{re}(\overline{Z}_{2Fd}*\overline{I}_{2F})*\text{im}(\overline{U}_1))/(-$$

$$\text{im}(\overline{I}_{1F})*\text{re}(\overline{Z}_{2Fd}*\overline{I}_{2F})+\text{re}(\overline{I}_{2F})*\text{im}(\overline{Z}_{1Fd}*\overline{I}_{1F})+\text{im}(\overline{I}_{1F})*\text{re}(\overline{Z}_{1Fd}*\overline{I}_{1F})+$$

$$\text{re}(\overline{I}_{1F})*\text{im}(\overline{Z}_{2Fd}*\overline{I}_{2F})-\text{im}(\overline{I}_{2F})*\text{re}(\overline{Z}_{1Fd}*\overline{I}_{1F})-$$

$$\text{re}(\overline{I}_{1F})*\text{im}(\overline{Z}_{1Fd}*\overline{I}_{1F})+\text{im}(\overline{I}_{2F})*\text{re}(\overline{Z}_{2Fd}*\overline{I}_{2F})-\text{re}(\overline{I}_{2F})*\text{im}(\overline{Z}_{2Fd}*\overline{I}_{2F}))\quad\text{(Eq. 11)}$$

The solution of $R_F$ (fault impedance is assumed to be purely resistive, i.e. $\overline{Z}_F=R_F+jX_F=R_F$) in case of a three-phase fault can be derived from Eq. 8:

$$R_{F23p}=-(-\text{re}(\overline{Z}_{1Fd}*\overline{I}_{1F})*\text{im}(\overline{U}_1)+\text{re}(\overline{Z}_{1Fd}*\overline{I}_{1F})8v*\text{im}(\overline{Z}_{1Fd}*\overline{I}_1)+$$

$$\text{re}(\overline{U}_1)*\text{im}(\overline{Z}_{1Fd}*\overline{I}_{1F})-v*\text{re}(\overline{Z}_{1Fd}*\overline{I}_1)*\text{im}(\overline{Z}_{1Fd}*\overline{I}_{1F}))/(\text{im}(\overline{I}_{1F})*\text{re}(\overline{Z}_{1Fd}*\overline{I}_{1F})-$$

$$\text{re}(\overline{I}_{1F})*\text{im}(\overline{Z}_{1Fd}*\overline{I}_{1F}))\quad\text{(Eq. 12)}$$

According to an embodiment, current and voltage variables used in Eq. 1 to Eq. 12 are preferably selected (step 112) as follows based on faulted phases:

| Fault type | $U_1$ | $U_2$ | $I_1$ | $I_2$ | $I_{1F}$ | $I_{2F}$ |
|---|---|---|---|---|---|---|
| L12 | $U_1$ | $U_2$ | $I_1$ | $I_2$ | $I_{1F}$ | $I_{2F}$ |
| L23 | $a^2 \cdot U_1$ | $a \cdot U_2$ | $a^2 \cdot I_1$ | $a \cdot I_2$ | $a^2 \cdot I_{1F}$ | $a \cdot I_{2F}$ |

Figure 4:
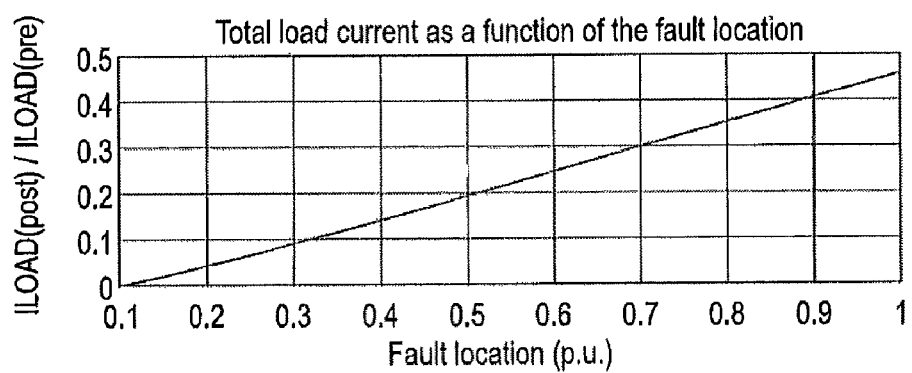
FIG. 4 illustrates an example of a ratio of a load current during a fault and a pre-fault load current.

| Fault type | $U_1$ | $U_2$ | $I_1$ | $I_2$ | $I_{1F}$ | $I_{2F}$ |
|---|---|---|---|---|---|---|
| L31 | $\bar{a} \cdot U_1$ | $U_2$ | $\bar{a} \cdot I_1$ | $I_2$ | $\bar{a} \cdot I_{1F}$ | $I_{2F}$ |
| L123 | $U_1$ | $U_2$ | $I_1$ | $I_2$ | $I_{1F}$ | $I_{2F}$ | where $\bar{U}_1$=positive sequence voltage component=$(\bar{U}_{L1}+\bar{a}^2 \cdot \bar{U}_{L2}+\bar{a} \cdot \bar{U}_{L3})/3$ $\bar{U}_2$=negative sequence voltage component=$(\bar{U}_{L1}+\bar{a}^2 \cdot \bar{U}_{L2}+\bar{a} \cdot \bar{U}_{L3})/3$ $\bar{I}_1$=positive sequence current component=$(\bar{I}_{L1}+\bar{a}^2 \cdot \bar{I}_{L2}+\bar{a} \cdot \bar{I}_{L3})/3$ $\bar{I}_2$=negative sequence current component=$(\bar{I}_{L1}+\bar{a}^2 \cdot \bar{I}_{L2}+\bar{a} \cdot \bar{I}_{L3})/3$ $\bar{a}=\cos(120°)+j \cdot \sin(120°)$ The key variables in equations Eq. 1 to Eq. 12 are the fault current components $\bar{I}_{1F}$ and $\bar{I}_{2F}$. They are preferably selected (step 112) as follows:

$$\bar{I}_{1F}=\bar{I}_1-k \cdot \bar{I}_{1prefault}$$

$$\bar{I}_{2F}=\bar{I}_2-k \cdot \bar{I}_{2prefault}$$

where $\bar{I}_{1prefault}$=pre-fault positive sequence current component
$\bar{I}_{2prefault}$=pre-fault negative sequence current component Parameter k is denoted as a load current reduction factor. It is a scalar number and takes into account the fact that due to short-circuit condition the phase-to-earth and phase-to-phase voltages of the faulty phases are affected. As electrical loads are connected between phases, the pre-fault load condition is not valid during the fault. The actual load current magnitude during the fault depends on the voltage characteristics of individual load taps. The fact that the load current during the fault differs from the pre-fault load is illustrated in FIG. 4. FIG. 4 illustrates the ratio of a load current during fault to a pre-fault load current. In the illustrated example, a load of 3 MVA is evenly distributed along a 40 km long OH-line at 0.1 p.u. steps (ten load taps, each 0.075 MVA). The loads are modeled as constant impedances. Parameter k takes into account the change caused in the load current by fault. Parameter k would be equal to one only in case the load current would not change due to a fault.

Calculation of Parameter k Based on Network Calculations (Step 108)

Figure 5:
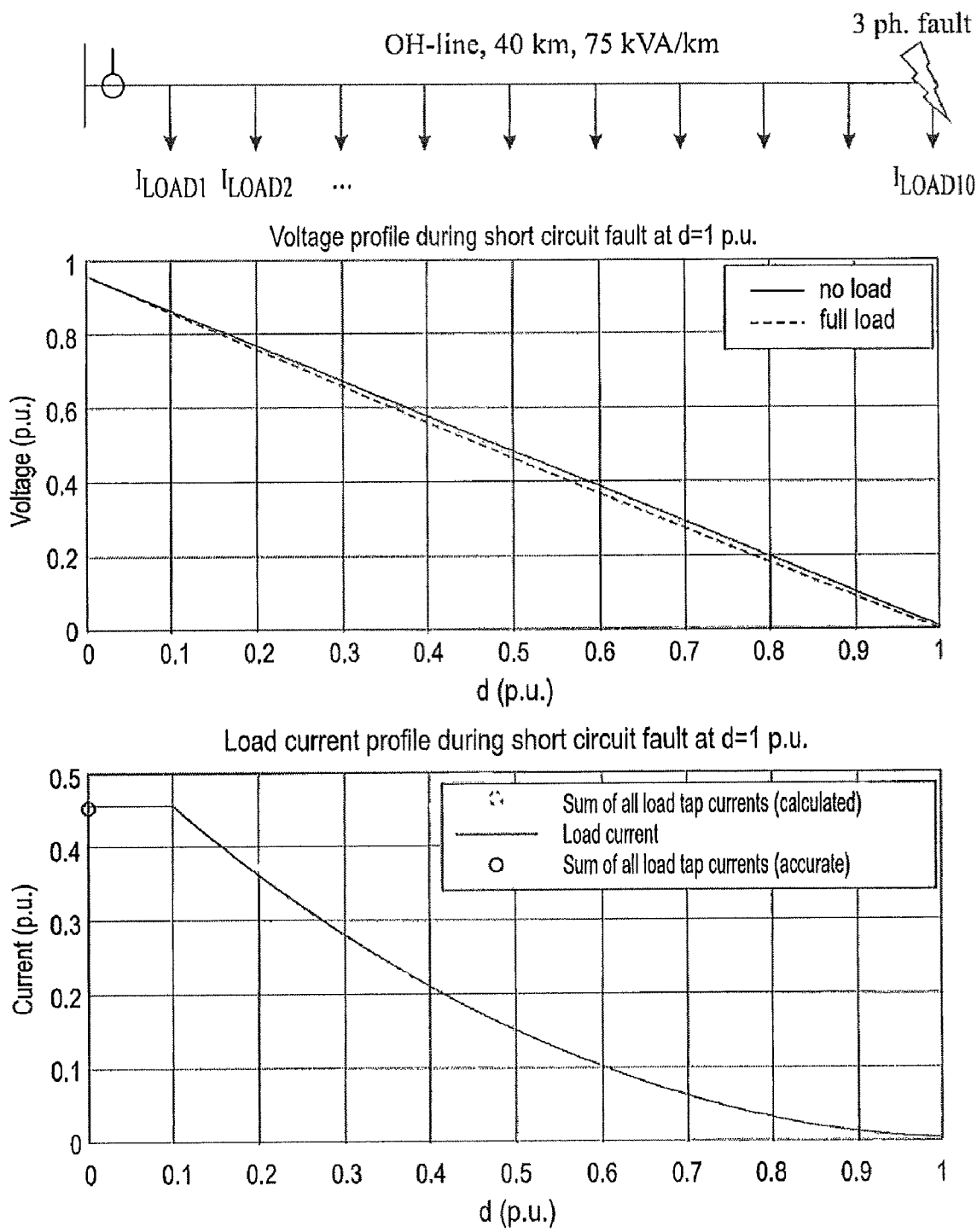
FIG. 5 illustrates calculation of parameter k according to an embodiment.

Parameter k can be defined as being the relation between the sums of load currents during and before a fault, when the fault occurs at the end point of the electric line (where maximum healthy-state voltage drop can be measured). It can be determined as follows: (Eq. 13)

$$k = \frac{\sum iload_n(\text{fault})}{\sum iload_n(\text{pre-fault})},$$

where $iload_n$(fault)=load current component of load tap n during fault
$iload_n$(pre-fault)=pre-fault load current component of load tap n Determining load current during the fault requires that the voltage profile of the electric line during the fault at the endpoint of the line is calculated. This is illustrated in FIG. 5, in the middle thereof. The voltage drop is mainly due to the fault current component and therefore in hand calculation of the voltage profile, loading can be assumed to be zero. By dividing the voltage during the fault by the load impedance of each load tap, load currents of individual load taps can be calculated. This is illustrated in FIG. 5, at the bottom thereof. Parameter k is obtained as a result; here k>>0.45 (it is marked with a dot in FIG. 5, bottom). In the example of FIG. 5 a fault occurs at the end point of the electric line, and a load of 3 MVA is evenly distributed along a 40 km long OH-line at 0.1 p.u. steps (ten load taps, each 0.075 MVA). The loads are modeled as constant impedances.

According to an embodiment, the loading of the electric line is taken into account by modeling it. The loading is preferably modeled with a fictitious load tap located at distance v [0 . . . 1 p.u.] from the measuring point. Parameter v represents this equivalent load distance. In other words, parameter v indicates a distance of an equivalent load point from the measuring point, which equivalent load point equals to a total load of the electric line modeled to be concentrated in a single point of the electric line. Parameter v can be determined on the basis of a load current during the fault on the three-phase electric line or on the basis of a load current during a healthy state of the three-phase electric line. As the voltage decreases during a fault, also the load current is affected at each load point. Thus the result based on the load current during the fault is typically more accurate.

Calculation of Parameter v Based on Network Calculations (Step 101 and 104)

Figure 6:
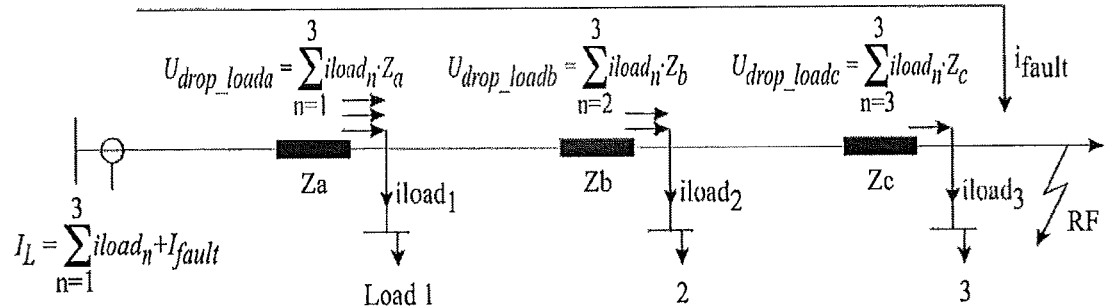
FIG. 6 illustrates the calculation of a voltage drop curve during a fault due to a load current component according to an embodiment.
Figure 7:
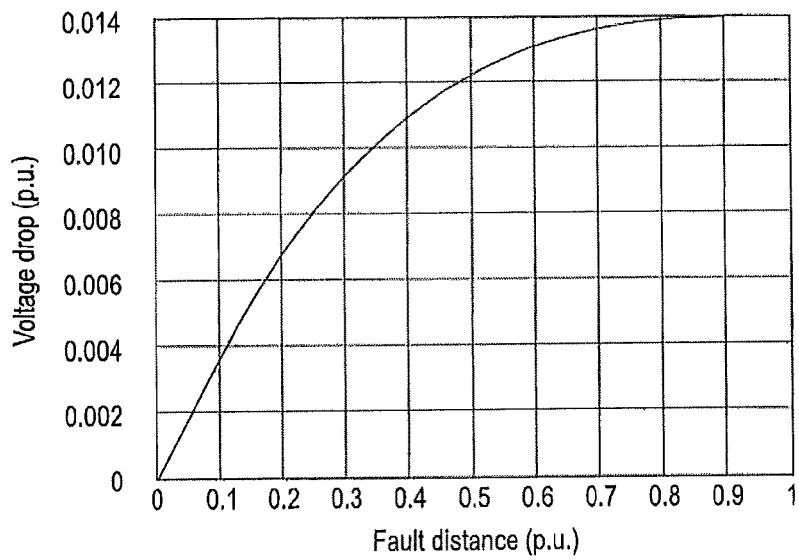
FIG. 7 illustrates an example of a voltage drop curve during a fault.

One way of determining parameter v is to calculate the voltage drop curve during the fault due to the load current component for the electric line. Such a curve can be composed by first calculating the load currents of each load tap during the fault and by multiplying these currents by the impedance through which the current flows. An example of such a calculation is illustrated in FIG. 6. FIG. 6 illustrates the calculation (step 110) of the voltage drop curve during the fault due to the load current component. The figure shows three load taps having respective load currents $iload_1$, $iload_2$ and $iload_3$. The fault current is $I_{fault}$ and the line impedances of the three line sections are Za, Zb and Zc. The voltage drops caused by the fault current are $U_{drop\_faulta}$, $U_{drop\_faultb}$ and $U_{drop\_faultc}$. $U_{drop\_loada}$, $U_{drop\_loadb}$ and $U_{drop\_loadc}$ are the values of the voltage drop curve at distances defined by the load tap locations. An example of a voltage drop curve during the fault due to the load current component for the electric line based on simulated data is shown in FIG. 7.

Figure 8:
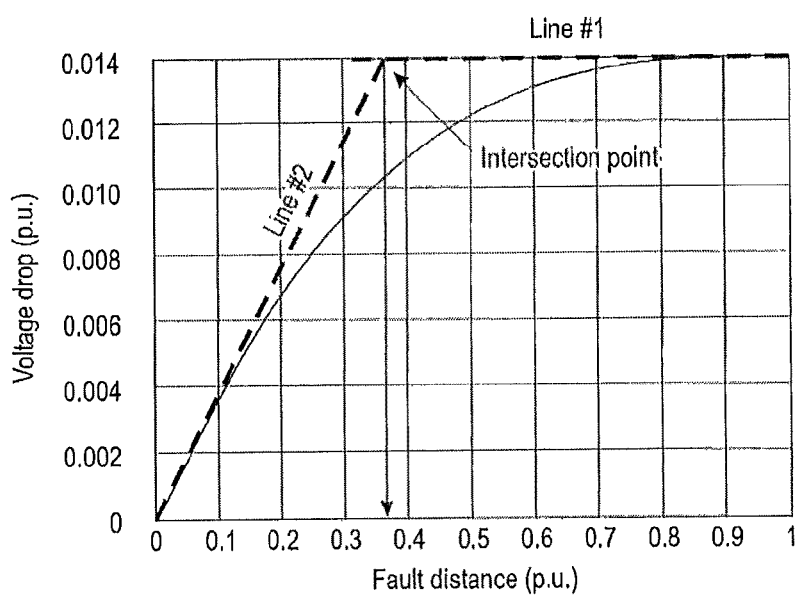
FIG. 8 illustrates determination of parameter v according to an embodiment.

When two lines are drawn such that one is tangential to the curve and the other equals to the maximum voltage drop, the intersection point of these lines shows the distance of the equivalent load, i.e. the value of parameter v. This is illustrated in FIG. 8. In the illustrated example v=0.36.

The previously described calculation procedure for parameters k and/or v could be implemented in DMS (Distribution Management System) or similar system.

Calculation of Parameter v Based on a Trial 2-or 3-Phase Faults (Step 102 and 105)

Another way of determining parameter v is to conduct a trial 2-or 3-phase fault at distance d from the measuring point (parameter k should be known beforehand), in which case parameter v can be determined (step 111) in case of a phase-to-phase fault from Eq. 7:

$$v_{pp}=(\text{re}(\bar{I}_{1F})*\text{im}(\bar{Z}_{2Fd}*\bar{I}_{2F})*d+\text{im}(\bar{I}_{1F})*\text{re}(\bar{Z}_{1Fd}*\bar{I}_{1F})*d+\text{re}(\bar{I}_{1F})*\text{im}(\bar{U}_1)-$$

$$\text{re}(\bar{I}_{1F})*\text{im}(\bar{U}_2)-\text{im}(\bar{I}_{1F})*\text{re}(\bar{Z}_{2Fd}*\bar{I}_{2F})*d+\text{re}(\bar{I}_{2F})*\text{im}(\bar{Z}_{1Fd}*\bar{I}_{1F})*d-$$

$$\text{re}(\bar{I}_{2F})*\text{im}(\bar{Z}_{2Fd}*\bar{I}_{2F})*d-\text{im}(\bar{I}_{2F})*\text{re}(\bar{Z}_{1Fd}*\bar{I}_{1F})*d-$$

$\mathrm{re}(\bar{I}_{1F})^*\mathrm{im}(\bar{Z}_{1Fd}^*\bar{I}_{1F})^*d+\mathrm{im}(\bar{I}_{2F})^*\mathrm{re}(\bar{U}_1)+\mathrm{im}(\bar{I}_{2F})^*\mathrm{re}(\bar{Z}_{2Fd}^*\bar{I}_{2F})^*d-\mathrm{im}(\bar{I}_{1F})^*\mathrm{re}(\bar{U}_1)-$ $\mathrm{re}(\bar{I}_{2F})^*\mathrm{im}(\bar{U}_1)-\mathrm{im}(\bar{I}_{2F})^*\mathrm{re}(\bar{U}_2)+\mathrm{im}(\bar{I}_{1F})^*\mathrm{re}(\bar{U}_2)+\mathrm{re}(\bar{I}_{2F})^*\mathrm{im}(\bar{U}_2))/(-$ $\mathrm{im}(\bar{I}_{1F})^*\mathrm{re}(\bar{Z}_{1Fd}^*\bar{I}_1)+\mathrm{re}(\bar{I}_{1F})^*\mathrm{im}(\bar{Z}_{1Fd}^*\bar{I}_1)+\mathrm{im}(\bar{I}_{1F})^*\mathrm{re}(\bar{Z}_{1Fd}^*\bar{I}_{1F})+$ $\mathrm{im}(\bar{I}_{1F})^*\mathrm{re}(\bar{Z}_{2Fd}^*\bar{I}_2)+\mathrm{re}(\bar{I}_{1F})^*\mathrm{im}(\bar{Z}_{2Fd}^*\bar{I}_{2F})-$ $\mathrm{im}(\bar{I}_{1F})^*\mathrm{re}(\bar{Z}_{2Fd}^*\bar{I}_{2F})+\mathrm{im}(\bar{I}_{2F})^*\mathrm{re}(\bar{Z}_{1Fd}^*\bar{I}_1)-\mathrm{re}(\bar{I}_{2F})^*\mathrm{im}(\bar{Z}_{1Fd}^*\bar{I}_1)-$ $\mathrm{im}(\bar{I}_{2F})^*\mathrm{re}(\bar{Z}_{1Fd}^*\bar{I}_{1F})-\mathrm{im}(\bar{I}_{2F})^*\mathrm{re}(\bar{Z}_{2Fd}^*\bar{I}_2)-$ $\mathrm{re}(\bar{I}_{2F})^*\mathrm{im}(\bar{Z}_{2Fd}^*\bar{I}_{2F})+\mathrm{im}(\bar{I}_{2F})^*\mathrm{re}(\bar{Z}_{2Fd}^*\bar{I}_{2F})-\mathrm{re}(\bar{I}_{1F})^*\mathrm{im}(\bar{Z}_{1Fd}^*\bar{I}_{1F})-$ $\mathrm{re}(\bar{I}_{1F})^*\mathrm{im}(\bar{Z}_{2Fd}^*\bar{I}_2)+\mathrm{re}(\bar{I}_{2F})^*\mathrm{im}(\bar{Z}_{1Fd}^*\bar{I}_{1F})+\mathrm{re}(\bar{I}_{2F})^*\mathrm{im}(\bar{Z}_{2Fd}^*\bar{I}_2))$ (Eq. 14)

In case of a three-phase fault parameter v can be determined (step 111) from Eq. 8:

$V_{3p}=(\mathrm{re}(\bar{I}_{1F})^*\mathrm{im}(\bar{U}_1)-\mathrm{re}(\bar{I}_{1F})^*\mathrm{im}(\bar{Z}_{1Fd}^*\bar{I}_{1F})^*d-$ $\mathrm{im}(\bar{I}_{1F})^*\mathrm{re}(\bar{U}_1)+\mathrm{im}(\bar{I}_{1F})^*\mathrm{re}(\bar{Z}_{1Fd}^*\bar{I}_{1F})^*d)/(\mathrm{re}(\bar{I}_{1F})^*\mathrm{im}(\bar{Z}_{1Fd}^*\bar{I}_1)-$ $\mathrm{re}(\bar{I}_{1F})^*\mathrm{im}(\bar{Z}_{1Fd}^*\bar{I}_{1F})-\mathrm{im}(\bar{I}_{1F})^*\mathrm{re}(\bar{Z}_{1Fd}^*\bar{I}_1)+\mathrm{im}(\bar{I}_{1F})^*\mathrm{re}(\bar{Z}_{1Fd}^*\bar{I}_{1F}))$ (Eq. 15)

Practical Implementation of the Calculation of Parameter v (Step 103 or 106)

In practice, the determination of parameter k as described above (Eq. 13) may be burdensome in some situations, because it requires that the load current be extracted from the total phase current during the fault. The determination of the load current during the fault requires that the voltage profile of the electric line during the fault at the endpoint of the line is calculated. The load current can be calculated by dividing the voltage during the fault with load impedance. The voltage drop is also dependent on the load magnitude and the power factor. In practice, the following variation of the method can be used in which parameter v is approximated by determining parameter v on the basis of the load current during a healthy state of the three-phase electric line. According to this alternative, parameter v can be determined by means of calculations. The calculation (step 103) of parameter v can be based on calculating the resulting voltage drop along the electric line in two different loading conditions. Parameter v is the quotient of voltage drops in these two different loading conditions:

$$v = \frac{U_{drop(real)}}{U_{drop(s=1)}}$$

where $U_{drop(real)}$=the actual maximum voltage drop on the electric line $U_{drop(s=1)}$=a fictious voltage drop, if all load is tapped at the end of the electric line.

The actual maximum voltage drop, $U_{drop(real)}$, results from the actual load distribution at the furthest point of a radial electric line. The value can be obtained from a network calculation program, for example.

The fictious voltage drop, $U_{drop(s=1)}$, results when a load corresponding to the actual maximum voltage drop is tapped at a single point at the furthest point of the electric line. The voltage drop can be calculated with the following simple equation:

$$U_{drop(s=1)} = \frac{\mathrm{abs}(\bar{Z}_1 \cdot \bar{S})}{U^2} \cdot 100\%$$

where $\bar{Z}_1$=positive sequence impedance from the measuring point to the point where the voltage drop is at its maximum $\bar{S}$=Total apparent load of the electric line (=P+j·Q)

P=Real part of the apparent load, real power

Q=Imaginary part of the apparent load, reactive power

U=Nominal voltage at the measuring point (phase-to-phase)

Alternatively, parameter v can be determined (step 106) by means of measurements. The measurement of parameter v can be conducted by making a single-phase earth fault ($R_F$=0 ohm) at the furthest point of the electric line (d=1), where the maximum actual voltage drop takes place. Parameter v can be calculated using the following equations and setting d=1:

Assuming that the term $\bar{I}_{0Fd}/2$ is dependent on d:

$v(d)=-0.5*(2*\mathrm{re}(\bar{I}_F)*\mathrm{im}(\bar{U}_L)+2*\mathrm{im}(\bar{I}_F)*\mathrm{re}(\bar{Z}_{2Fd}^*\bar{I}_F)*d-$ $2*\mathrm{re}(\bar{I}_F)*\mathrm{im}(\bar{Z}_{1Fd}^*\bar{I}_F)*d+2*\mathrm{im}(\bar{I}_F)*d*\mathrm{re}(\bar{Z}_{0Fd}^*\bar{I}_0)+\mathrm{im}(\bar{I}_F)*d^2*\mathrm{re}(\bar{Z}_{0Fd}^*\bar{I}_{0Fd})-$ $2*\mathrm{re}(\bar{I}_F)*\mathrm{im}(\bar{Z}_{2Fd}^*\bar{I}_F)*d-2*\mathrm{re}(\bar{I}_F)*d*\mathrm{im}(\bar{Z}_{0Fd}^*\bar{I}_0)-1*\mathrm{re}(\bar{I}_F)*d^2*\mathrm{im}(\bar{Z}_{0Fd}^*\bar{I}_{0Fd})-$ $2*\mathrm{im}(\bar{I}_F)*\mathrm{re}(\bar{U}_L)+2*\mathrm{im}(\bar{I}_F)*\mathrm{re}(\bar{Z}_{1Fd}^*\bar{I}_F)*d)/(-$ $1*\mathrm{re}(\bar{I}_F)*\mathrm{im}(\bar{Z}_{1Fd}^*\bar{I}_1)+\mathrm{re}(\bar{I}_F)*\mathrm{im}(\bar{Z}_{1Fd}^*\bar{I}_F)-$ $1*\mathrm{re}(\bar{I}_F)*\mathrm{im}(\bar{Z}_{2Fd}^*\bar{I}_2)+\mathrm{re}(\bar{I}_F)*\mathrm{im}(\bar{Z}_{2Fd}^*\bar{I}_F)+\mathrm{im}(\bar{I}_F)*\mathrm{re}(\bar{Z}_{1Fd}^*\bar{I}_1)-$ $1*\mathrm{im}(\bar{I}_F)*\mathrm{re}(\bar{Z}_{1Fd}^*\bar{I}_F)+\mathrm{im}(\bar{I}_F)*\mathrm{re}(\bar{Z}_{2Fd}^*\bar{I}_2)-1*\mathrm{im}(\bar{I}_F)*\mathrm{re}(\bar{Z}_{2Fd}^*\bar{I}_F))$ or assuming that the term $\bar{I}_{0Fd}/2$ is independent of d:

$v(d)=0.5*(2*\mathrm{re}(\bar{I}_F)*\mathrm{im}(\bar{U}_L)+2*\mathrm{im}(\bar{I}_F)*\mathrm{re}(\bar{Z}_{2Fd}^*\bar{I}_F)*d-$ $2*\mathrm{re}(\bar{I}_F)*\mathrm{im}(\bar{Z}_{1Fd}^*\bar{I}_F)*d+2*\mathrm{im}(\bar{I}_F)*d*\mathrm{re}(\bar{Z}_{0Fd}^*\bar{I}_0)+\mathrm{im}(\bar{I}_F)*d*\mathrm{re}(\bar{Z}_{0Fd}^*\bar{I}_{0Fd})-$ $2*\mathrm{re}(\bar{I}_F)*\mathrm{im}(\bar{Z}_{2Fd}^*\bar{I}_F)*d-2*\mathrm{re}(\bar{I}_F)*d*\mathrm{im}(\bar{Z}_{0Fd}^*\bar{I}_0)-1*\mathrm{re}(\bar{I}_F)*d*\mathrm{im}(\bar{Z}_{0Fd}^*\bar{I}_{0Fd})-$ $2*\mathrm{im}(\bar{I}_F)*\mathrm{re}(\bar{U}_L)+2*\mathrm{im}(\bar{I}_F)*\mathrm{re}(\bar{Z}_{1Fd}^*\bar{I}_F)*d)/(\mathrm{re}(\bar{I}_F)*\mathrm{im}(\bar{Z}_{1Fd}^*\bar{I}_1)-$ $1*\mathrm{re}(\bar{I}_F)*\mathrm{im}(\bar{Z}_{1Fd}^*\bar{I}_F)+\mathrm{re}(\bar{I}_F)*\mathrm{im}(\bar{Z}_{2Fd}^*\bar{I}_2)-1*\mathrm{re}(\bar{I}_F)*\mathrm{im}(\bar{Z}_{2Fd}^*\bar{I}_F)-$ $1*\mathrm{im}(\bar{I}_F)*\mathrm{re}(\bar{Z}_{1Fd}^*\bar{I}_1)+\mathrm{im}(\bar{I}_F)*\mathrm{re}(\bar{Z}_{1Fd}^*\bar{I}_F)-$ $1*\mathrm{im}(\bar{I}_F)*\mathrm{re}(\bar{Z}_{2Fd}^*\bar{I}_2)+\mathrm{im}(\bar{I}_F)*\mathrm{re}(\bar{Z}_{2Fd}^*\bar{I}_F))$ where $\bar{U}_L$=faulted phase voltage $\bar{Z}_{0Fd}$=Zero sequence impedance of the electric line per phase $\bar{Y}_{0Fd}$=Phase-to-earth admittance of the electric line per phase $\bar{I}_0$=Zero sequence current measured at the measuring point $\bar{I}_{0Fd}$=Zero sequence charging current of the electric line itself In practice, the loading varies in time and place and thus the value of v is never totally constant. There is also a slight variation of v between phases, as the loading of different phases is in practice never perfectly balanced. The determination of v is therefore preferably done in different loading scenarios to allow the variation of v to be evaluated. The value representing the most typical loading condition should preferably be used as a value for v.

When parameter v is known, then parameter k (the load current reduction factor) can be calculated (step 107 or 109) by conducting a trial three-phase fault and/or a trial two-phase fault at known fault distance d and by recording phase voltages and currents before and during the fault. The equivalent fault distance v, fault resistance RF and positive sequence impedance $\overline{Z}_1$ should also be known (for conductors applies $\overline{Z}_2=\overline{Z}_1$). Parameter k can be calculated using (Eq. 7) for phase-to-phase fault and (Eq. 8) for three phase fault and by inserting $\overline{I}_{1F}=\overline{I}_1-K\cdot\overline{I}_{1prefault}$ and $\overline{I}_{2F}=\overline{I}_2-k\cdot\overline{I}_{2prefault}$ and by using the real and imaginary components.

For phase-to-phase fault the solution for k results in a second order polynomial giving two alternative solutions for k, $k_{pp1}$ and $k_{pp2}$:

$\overline{A}=-\text{im}(\overline{I}_{1Fault})^*\text{re}(\overline{U}_1)+\text{im}(\overline{I}_{1Fault})^*\text{re}(\overline{U}_2)+\text{im}(\overline{I}_{2Fault})^*\text{re}(\overline{U}_1)-$ $\text{im}(\overline{I}_{2Fault})^*\text{re}(\overline{U}_2)+\text{im}(\overline{U}_1)^*\text{re}(\overline{I}_{1Fault})-\text{im}(\overline{U}_1)^*\text{re}(\overline{I}_{2Fault})-$ $\text{im}(\overline{U}_2)^*\text{re}(\overline{I}_{1Fault})+\text{im}(\overline{U}_2)^*\text{re}(\overline{I}_{2Fault})+\text{im}(\overline{Z}_{2Fd}^*\overline{I}_{2Fault})^*d^*\text{re}(\overline{I}_{1Fault})+$ $s^*\text{im}(\overline{Z}_{2Fd}^*\overline{I}_2)^*\text{re}(\overline{I}_{1Fault})+\text{im}(\overline{I}_{1Fault})^*\text{re}(\overline{Z}_{2Fd}^*\overline{I}_{2Fault})^*s+$ $\text{im}(\overline{I}_{1Fault})^*\text{re}(\overline{Z}_{1Fd}^*\overline{I}_{1Fault})^*d-s^*\text{im}(\overline{Z}_{2Fd}^*\overline{I}_2)^*\text{re}(\overline{I}_{2Fault})-\text{im}(\overline{I}_{1Fault})^*s^*\text{re}(\overline{Z}_{2Fd}^*\overline{I}_2)-$ $\text{im}(\overline{Z}_{2Fd}^*\overline{I}_{2Fault})^*s^*\text{re}(\overline{I}_{1Fault})-$ $\text{im}(\overline{Z}_{2Fd}^*\overline{I}_{2Fault})^*d^*\text{re}(\overline{I}_{2Fault})+\text{im}(\overline{I}_{2Fault})^*\text{re}(\overline{Z}_{1Fd}^*\overline{I}_{1Fault})^*s+$ $\text{im}(\overline{Z}_{1Fd}^*\overline{I}_{1Fault})^*d^*\text{re}(\overline{I}_{2Fault})-\text{im}(\overline{I}_{1Fault})^*\text{re}(\overline{Z}_{1Fd}^*\overline{I}_{1Fault})^*s-$ $s\text{im}(\overline{Z}_{1Fd}^*\overline{I}_1)^*\text{re}(\overline{I}_{1Fault})+\text{im}(\overline{I}_{1Fault})^*s^*\text{re}(\overline{Z}_{1Fd}^*\overline{I}_1)+\text{im}(\overline{Z}_{2Fd}^*\overline{I}_{2Fault})^*s^*\text{re}(\overline{I}_{2Fault})$ $-\text{im}(\overline{I}_{2Fault})^*\text{re}(\overline{Z}_{1Fd}^*\overline{I}_{1Fault})^*d+\text{im}(\overline{Z}_{1Fd}^*\overline{I}_{1Fault})^*s^*\text{re}(\overline{I}_{1Fault})-$ $\text{im}(\overline{Z}_{1Fd}^*\overline{I}_{1Fault})^*s^*\text{re}(\overline{I}_{2Fault})+\text{im}(\overline{I}_{2Fault})^*s^*\text{re}(\overline{Z}_{2Fd}^*\overline{I}_2)-$ $\text{im}(\overline{I}_{1Fault})^*\text{re}(\overline{Z}_{2Fd}^*\overline{I}_{2Fault})^*d-$ $\text{im}(\overline{I}_{2Fault})^*\text{re}(\overline{Z}_{2Fd}^*\overline{I}_{2Fault})^*s+\text{im}(\overline{I}_{2Fault})^*\text{re}(\overline{Z}_{2Fd}^*\overline{I}_{2Fault})^*d+(-$ $\text{im}(\overline{Z}_{1Fd}^*\overline{I}_{1Prefault})^*s^*\text{re}(\overline{I}_{2Prefault})+\text{im}(\overline{Z}_{2Fd}^*\overline{I}_{1Prefault})^*d^*\text{re}(\overline{I}_{1Prefault})-$ $\text{im}(\overline{Z}_{2Fd}^*\overline{I}_{2Prefault})^*d^*\text{re}(\overline{I}_{2Prefault})-$ $\text{im}(\overline{Z}_{2Fd}^*\overline{I}_{2Prefault})^*s^*\text{re}(\overline{I}_{1Prefault})+\text{im}(\overline{Z}_{1Fd}^*\overline{I}_{2Prefault})^*s^*\text{re}(\overline{I}_{2Prefault})+$ $\text{im}(\overline{Z}_{1Fd}^*\overline{I}_{1Prefault})^*s^*\text{re}(\overline{I}_{1Prefault})+\text{im}(\overline{I}_{1Prefault})^*\text{re}(\overline{Z}_{1Fd}^*\overline{I}_{1Prefault})^*d-$ $\text{im}(\overline{I}_{1Prefault})^*\text{re}(\overline{Z}_{1Fd}^*\overline{I}_{1Prefault})^*s-$ $\text{im}(\overline{I}_{1Prefault})^*\text{re}(\overline{Z}_{2Fd}^*\overline{I}_{2Prefault})^*d+\text{im}(\overline{I}_{1Prefault})^*\text{re}(\overline{Z}_{2Fd}^*\overline{I}_{2Prefault})^*s-$ $\text{im}(\overline{I}_{2Prefault})^*\text{re}(\overline{Z}_{1Fd}^*\overline{I}_{1Prefault})^*d+\text{im}(\overline{I}_{1Prefault})^*\text{re}(\overline{Z}_{1Fd}^*\overline{I}_{1Prefault})^*s+$ $\text{im}(\overline{I}_{2Prefault})^*\text{re}(\overline{Z}_{2Fd}^*\overline{I}_{2Prefault})^*d-\text{im}(\overline{I}_{2Prefault})^*\text{re}(\overline{Z}_{2Fd}^*\overline{I}_{2Prefault})^*s-$ $\text{im}(\overline{Z}_{1Fd}^*\overline{I}_{1Prefault})^*d^*\text{re}(\overline{I}_{1Prefault})+\text{im}(\overline{Z}_{1Fd}^*\overline{I}_{1Prefault})^*d^*\text{re}(\overline{I}_{2Prefault})$ $\overline{B}=\text{im}(\overline{U}_2)^*\text{re}(\overline{I}_{1Prefault})-\text{im}(\overline{U}_2)^*\text{re}(\overline{I}_{2Prefault})+\text{im}(\overline{U}_1)^*\text{re}(\overline{I}_{2Prefault})-$ $\text{im}(\overline{U}_1)^*\text{re}(\overline{I}_{1Prefault})-$ $d^*\text{re}(\overline{Z}_{1Fd}^*\overline{I}_{1Fault})^*\text{im}(\overline{I}_{1Prefault})+d^*\text{re}(\overline{Z}_{2Fd}^*\overline{I}_{2Fault})^*\text{im}(\overline{I}_{1Prefault})$ $+d^*\text{re}(\overline{Z}_{1Fd}^*\overline{I}_{1Fault})^*\text{im}(\overline{I}_{2Prefault})-d^*\text{re}(\overline{Z}_{2Fd}^*\overline{I}_{2Fault})^*\text{im}(\overline{I}_{2Prefault})-$ $d^*\text{re}(\overline{Z}_{1Fd}^*\overline{I}_{1Prefault})^*\text{im}(\overline{I}_{1Fault})+d^*\text{re}(\overline{Z}_{2Fd}^*\overline{I}_{2Prefault})^*\text{im}(\overline{I}_{1Fault})+$ $d^*\text{re}(\overline{Z}_{1Fd}^*\overline{I}_{1Prefault})^*\text{im}(\overline{I}_{2Fault})-d^*\text{re}(\overline{Z}_{2Fd}^*\overline{I}_{2Prefault})^*\text{im}(\overline{I}_{2Fault})-$ $\text{im}(\overline{I}_{1Prefault})^*s^*\text{re}(\overline{Z}_{1Fd}^*\overline{I}_1)+\text{im}(\overline{I}_{1Prefault})^*s^*\text{re}(\overline{Z}_{2Fd}^*\overline{I}_2)-$ $\text{im}(\overline{I}_{1Prefault})^*\text{re}(\overline{Z}_{2Fd}^*\overline{I}_{2Fault})^*s+\text{im}(\overline{I}_{2Prefault})^*s^*\text{re}(\overline{Z}_{1Fd}^*\overline{I}_1)-$ $\text{im}(\overline{I}_{2Prefault})^*\text{re}(\overline{Z}_{1Fd}^*\overline{I}_{1Fault})^*s-$ $\text{im}(\overline{I}_{2Prefault})^*s^*\text{re}(\overline{Z}_{2Fd}^*\overline{I}_2)+\text{im}(\overline{I}_{2Prefault})^*\text{re}(\overline{Z}_{2Fd}^*\overline{I}_{2Fault})^*s+\text{re}(\overline{U}_2)^*\text{im}(\overline{I}_{2Prefault})+$ $\text{re}(\overline{U}_1)^*\text{im}(\overline{I}_{1Prefault})-\text{re}(\overline{U}_2)^*\text{im}(\overline{I}_{1Prefault})-$ $\text{re}(\overline{U}_1)^*\text{im}(\overline{I}_{2Prefault})+\text{im}(\overline{I}_{1Fault})^*\text{re}(\overline{Z}_{1Fd}^*\overline{I}_{1Prefault})^*s-$ $\text{im}(\overline{I}_{1Fault})^*\text{re}(\overline{Z}_{2Fd}^*\overline{I}_{2Prefault})^*s-$ $\text{im}(\overline{I}_{2Fault})^*\text{re}(\overline{Z}_{1Fd}^*\overline{I}_{1Prefault})^*s+\text{im}(\overline{I}_{2Fault})^*\text{re}(\overline{Z}_{2Fd}^*\overline{I}_{2Prefault})^*s+$ $s\text{im}(\overline{Z}_{1Fd}^*\overline{I}_1)^*\text{re}(\overline{I}_{1Prefault})-$ $s^*\text{im}(\overline{Z}_{1Fd}^*\overline{I}_1)^*\text{re}(\overline{I}_{2Prefault})+\text{im}(\overline{Z}_{1Fd}^*\overline{I}_{1Fault})^*d^*\text{re}(\overline{I}_{1Prefault})-$ $\text{im}(\overline{Z}_{1Fd}^*\overline{I}_{1Fault})^*d^*\text{re}(\overline{I}_{2Prefault})-$ $\text{im}(\overline{Z}_{1Fd}^*\overline{I}_{1Fault})^*s^*\text{re}(\overline{I}_{1Prefault})+\text{im}(\overline{Z}_{1Fd}^*\overline{I}_{1Fault})^*s^*\text{re}(\overline{I}_{2Prefault})-$ $\text{im}(\overline{Z}_{1Fd}^*\overline{I}_{1Prefault})^*s^*\text{re}(\overline{I}_{1Fault})+\text{im}(\overline{Z}_{1Fd}^*\overline{I}_{1Prefault})^*s^*\text{re}(\overline{I}_{2Fault})-$ $s^*\text{im}(\overline{Z}_{2Fd}^*\overline{I}_2)^*\text{re}(\overline{I}_{1Prefault})+s^*\text{im}(\overline{Z}_{2Fd}^*\overline{I}_2)^*\text{re}(\overline{I}_{2Prefault})-$ $\text{im}(\overline{Z}_{2Fd}^*\overline{I}_{2Fault})^*d^*\text{re}(\overline{I}_{1Prefault})+\text{im}(\overline{Z}_{2Fd}^*\overline{I}_{2Fault})^*d^*\text{re}(\overline{I}_{2Prefault})+$ $\text{im}(\overline{Z}_{2Fd}^*\overline{I}_{2Fault})^*s^*\text{re}(\overline{I}_{1Prefault})-\text{im}(\overline{Z}_{2Fd}^*\overline{I}_{2Fault})^*s^*\text{re}(\overline{I}_{2Prefault})-$ $\text{im}(\overline{Z}_{2Fd}^*\overline{I}_{2Prefault})^*d^*\text{re}(\overline{I}_{1Fault})+\text{im}(\overline{Z}_{2Fd}^*\overline{I}_{2Prefault})^*d^*\text{re}(\overline{I}_{2Fault})+$ $\text{im}(\overline{Z}_{2Fd}^*\overline{I}_{2Prefault})^*s^*\text{re}(\overline{I}_{1Fault})-\text{im}(\overline{Z}_{2Fd}^*\overline{I}_{2Prefault})^*s^*\text{re}(\overline{I}_{2Fault})-$ $$\mathrm{im}(\overline{Z}_{1Fd}*\overline{I}_{1Prefault})*d*\mathrm{re}(\overline{I}_{2Fault})+\mathrm{im}(\overline{Z}_{1Fd}*\overline{I}_{1Prefault})*d*\mathrm{re}(\overline{I}_{1Fault})+$$

$$\mathrm{im}(\overline{I}_{1Prefault})*\mathrm{re}(\overline{Z}_{1Fd}*\overline{I}_{1Fault})*s$$

$$\overline{C}=-\mathrm{im}(\overline{Z}_{1Fd}*\overline{I}_{1Fault})*d*\mathrm{re}(\overline{I}_{1Fault})-$$

$$\mathrm{im}(\overline{I}_{2Fault})*s*\mathrm{re}(\overline{Z}_{1Fd}*\overline{I}_1)+s*\mathrm{im}(\overline{Z}_{1Fd}*\overline{I}_1)*\mathrm{re}(\overline{I}_{2Fault}))$$

$$k_{pp1}=(-\overline{B}+\mathrm{sqrt}(\overline{B}.*\overline{B}-4.*\overline{A}.*\overline{C}))./(2.*\overline{A}) \quad \text{(Eq. 16a)}$$

$$k_{pp2}=(-\overline{B}-\mathrm{sqrt}(\overline{B}.*\overline{B}-4.*\overline{A}.*\overline{C}))./(2.*\overline{A}) \quad \text{(Eq. 16b)}$$

The k-estimate is the one with positive sign 0<k<1 (in practice some error margin is needed).

For a three-phase fault the solution for k results in a second order polynomial giving two alternative solutions for k, $k_{3p1}$ and $k_{3p2}$:

$$\overline{A}=\mathrm{im}(\overline{I}_{1Prefault})*\mathrm{re}(\overline{Z}_{1Fd}*\overline{I}_{1Prefault})*d-\mathrm{im}(\overline{I}_{1Prefault})*\mathrm{re}(\overline{Z}_{1Fd}*\overline{I}_{1Prefault})*s-$$

$$\mathrm{im}(\overline{Z}_{1Fd}*\overline{I}_{1Prefault})*d*\mathrm{re}(\overline{I}_{1Prefault})+\mathrm{im}(\overline{Z}_{1Fd}*\overline{I}_{1Prefault})*s*\mathrm{re}(\overline{I}_{1Prefault})$$

$$\overline{B}=-\mathrm{im}(\overline{I}_{1Prefault})*s*\mathrm{re}(\overline{Z}_{1Fd}*\overline{I}_1)+\mathrm{im}(\overline{I}_{1Prefault})*\mathrm{re}(\overline{Z}_{1Fd}*\overline{I}_{1Fault})*s$$

$$+\mathrm{re}(\overline{U}_1)*\mathrm{im}(\overline{I}_{1Prefault})+s*\mathrm{im}(\overline{Z}_{1Fd}*\overline{I}_1)*\mathrm{re}(\overline{I}_{1Prefault})-d*\mathrm{re}(\overline{Z}_{1Fd}*\overline{I}_{1Prefault})*\mathrm{im}(\overline{I}_{1Fault})-$$

$$\mathrm{im}(\overline{U}_1)*\mathrm{re}(\overline{I}_{1Prefault})+\mathrm{im}(\overline{I}_{1Fault})*\mathrm{re}(\overline{Z}_{1Fd}*\overline{I}_{1Prefault})*s-$$

$$\mathrm{im}(\overline{Z}_{1Fd}*\overline{I}_{1Fault})*s*\mathrm{re}(\overline{I}_{1Prefault})-$$

$$d*\mathrm{re}(\overline{Z}_{1Fd}*\overline{I}_{1Fault})*\mathrm{im}(\overline{I}_{1Prefault})+\mathrm{im}(\overline{Z}_{1Fd}*\overline{I}_{1Fault})*d*\mathrm{re}(\overline{I}_{1Prefault})-$$

$$\mathrm{im}(\overline{Z}_{1Fd}*\overline{I}_{1Prefault})*s*\mathrm{re}(\overline{I}_{1Fault})+\mathrm{im}(\overline{Z}_{1Fd}*\overline{I}_{1Prefault})*d*\mathrm{re}(\overline{I}_{1Fault})$$

$$\overline{C}=-\mathrm{im}(\overline{I}_{1Fault})*\mathrm{re}(\overline{U}_1)+\mathrm{im}(\overline{I}_{1Fault})*s*\mathrm{re}(\overline{Z}_{1Fd}*\overline{I}_1)+\mathrm{im}(\overline{I}_{1Fault})*\mathrm{re}(\overline{Z}_{1Fd}*\overline{I}_{1Fault})*d-$$

$$\mathrm{im}(\overline{I}_{1Fault})*\mathrm{re}(\overline{Z}_{1Fd}*\overline{I}_{1Fault})*s+\mathrm{im}(\overline{U}_1)*\mathrm{re}(\overline{I}_{1Fault})+\mathrm{im}(\overline{Z}_{1Fd}*\overline{I}_{1Fault})*s*\mathrm{re}(\overline{I}_{1Fault})-$$

$$s*\mathrm{im}(\overline{Z}_{1Fd}*\overline{I}_1)*\mathrm{re}(\overline{I}_{1Fault})-\mathrm{im}(\overline{Z}_{1Fd}*\overline{I}_{1Fault})*d*\mathrm{re}(\overline{I}_{1Fault}))$$

$$K_{3p1}=(-\overline{B}+\mathrm{sqrt}(\overline{B}.*\overline{B}-4.*\overline{A}.*\overline{C}))./(2.*\overline{A}) \quad \text{(Eq. 17a)}$$

$$K_{3p2}=(-\overline{B}-\mathrm{sqrt}(\overline{B}.*\overline{B}-4.*\overline{A}.*\overline{C}))./(2.\overline{A}) \quad \text{(Eq. 17b)}$$

The k-estimate is the one with positive sign 0<k<1 (in practice some error margin is needed).

As parameter k is calculated using an approximated value of parameter v, its value can be treated as an "apparent" value. The use of Eq. 16 and 17 require either a trial fault (steps 102 and 109) at the end point of the line or a short-circuit calculation (steps 101 and 107) in a DMS system in order to obtain the voltage and current phasors during the fault. Sufficient accuracy can be obtained by neglecting the loading in the short-circuit voltage and current phasor calculation.

According to an embodiment, when two alternative estimates for fault distance d have been obtained from equations Eq. 3 and Eq. 9 (phase-to-phase fault) or Eq. 4 and Eq. 10 (three-phase fault), the correct result, d, is then selected (step 115) according to predetermined criteria. According to an embodiment, the selection of one of the determined two estimate values as the distance d between the measuring point and the point of fault is performed according to the following criteria:

Using equations Eq. 3 and Eq. 9 in case of phase-to-phase fault:
If 0<$d_{12p}$<v then d=$d_{12p}$, else d=$d_{22p}$ Using equations Eq. 4 and Eq. 10 in case of three-phase fault:
If 0<$d_{13p}$<v then d=$d_{13p}$, else d=$d_{23p}$ For reliable fault location estimation, the following additional checks can be made:

Value of d is positive

Value of d is between 0 . . . 1 (with some error margin)

Value of d has a stable behavior in time

Estimated fault resistance is below a certain limit. Based on field tests, the maximum fault resistance that can be detected may be several kilo-ohms. However, large fault resistance values affect the fault distance estimate by reducing the estimate.

An apparatus according to any one of the above embodiments, or a combination thereof, may be implemented as a single unit or as two or more separate units that are configured to implement the functionality of the various embodiments. Here the term 'unit' refers generally to a physical or logical entity, such as a physical device or a part thereof or a software routine. One or more of these units may reside in the protective relay unit 40, for example.

An apparatus according to any one of the embodiments may be implemented by means of a computer or corresponding digital signal processing equipment provided with suitable software, for example. Such a computer or digital signal processing equipment preferably comprises at least a working memory (RAM) providing storage area for arithmetical operations and a central processing unit (CPU), such as a general-purpose digital signal processor. The CPU may comprise a set of registers, an arithmetic logic unit, and a control unit. The control unit is controlled by a sequence of program instructions transferred to the CPU from the RAM. The control unit may contain a number of microinstructions for basic operations. The implementation of the microinstructions may vary depending on the CPU design. The program instructions may be coded by a programming language, which may be a high-level programming language, such as C, Java, etc., or a low-level programming language, such as a machine language, or an assembler. The computer may also have an operating system which may provide system services to a computer program written with the program instructions. The computer or other apparatus implementing the invention further preferably comprises suitable input means for receiving e.g. measurement and/or control data, which input means thus enable e.g. the monitoring of current and voltage quantities, and output means for outputting e.g. calculation results and/or control data. It is also possible to use a specific integrated circuit or circuits, or corresponding components and devices for implementing the functionality according to any one of the embodiments.

The invention can be implemented in existing system elements, such as various protective relays or relay arrangements, or by using separate dedicated elements or devices in a centralized or distributed manner. Present protective devices for electric systems, such as protective relays, typically comprise processors and memory that can be utilized in the functions according to embodiments of the invention. Thus, all modifications and configurations required for implementing an embodiment of the invention e.g. in existing protective devices may be performed as software routines, which may be implemented as added or updated software routines. If the functionality of the invention is implemented by software, such software can be provided as a computer program product comprising computer program code which, when run on a computer, causes the computer or corresponding arrangement to perform the functionality according to the invention as described above. Such a computer program code may be stored on a computer readable medium, such as suitable memory means, e.g. a flash memory or a disc memory from which it is loadable to the unit or units executing the program code. In addition, such a computer program code implementing the invention may be loaded to the unit or units executing the computer program code via a suitable data network, for example, and it may replace or update a possibly existing program code.

It will be obvious to a person skilled in the art that, as the technology advances, the inventive concept can be implemented in various ways. The invention and its embodiments are not limited to the examples described above but may vary within the scope of the claims.

What is claimed is:

1. A method for determining a distance of a phase-to-phase fault or a three-phase fault on a three-phase electric line of an electric network, the method comprising:
    monitoring current and voltage quantities of the three-phase electric line at a measuring point;
    detecting a phase-to-phase fault or a three-phase fault on the three-phase electric line;
    determining a first estimate value for a distance between the measuring point and a point of the detected phase-to-phase fault or three-phase fault on the basis of values of the monitored current and voltage quantities and a first equation which relates the current and voltage quantities to the distance and is based on a fault loop model of the electric line, in which model the point of fault is located between the measuring point and an equivalent load point, which equivalent load point equals to a total load of the electric line modeled to be concentrated in a single point of the electric line;
    determining a second estimate value for the distance between the measuring point and the point of the detected phase-to-phase fault or three-phase fault on the basis of values of the monitored current and voltage quantities and a second equation which relates the current and voltage quantities to the distance and is based on a fault loop model of the electric line, in which model the equivalent load point is located between the measuring point and the point of fault; and
    selecting according to predetermined criteria one of the determined two estimate values as the distance between the measuring point and the point of fault.

2. The method of claim 1, wherein, when the fault is a phase-to-phase fault, the first equation is:

$$\overline{U}_1 - \overline{U}_2 = d^* \overline{Z}_{1Fd}^* \overline{I}_1 + \overline{Z}_F/2^* \overline{I}_{1F} - d^* \overline{Z}_{2Fd}^* \overline{I}_2 - \overline{Z}_F/2^* \overline{I}_{2F},$$

and the second equation is:

$$\overline{U}_1 - \overline{U}_2 = v^* \overline{Z}_{1Fd}^* \overline{I}_1 + (d-v)^* \overline{Z}_{1Fd}^* \overline{I}_{1F} + \overline{Z}_F/2^* \overline{I}_{1F}$$
$$-v^* \overline{Z}_{2Fd}^* \overline{I}_2 - (d-v)^* \overline{Z}_{2Fd}^* \overline{I}_{2F} - \overline{Z}_F/2^* \overline{I}_{2F},$$

where
d=per unit fault distance from the measuring point to the fault point
$\overline{U}_1$=Positive sequence component voltage measured at the measuring point
$\overline{U}_2$=Negative sequence component voltage measured at the measuring point
$\overline{Z}_{1Fd}$=Positive sequence impedance of the electric line per phase
$\overline{Z}_{2Fd}$=Negative sequence impedance of the electric line per phase
$\overline{Z}_F$=Fault impedance between the phases
$\overline{I}_1$=Positive sequence component current measured at the measuring point
$\overline{I}_2$=Negative sequence component current measured at the measuring point
$\overline{I}_{1F}$=Positive sequence fault component current at the fault point
$\overline{I}_{2F}$=Negative sequence fault component current at the fault point
v=per unit distance of an equivalent load indicating a distance of the equivalent load point from the measuring point.

3. The method of claim 1, wherein, when the fault is a three-phase fault, the first equation is:

$$\overline{U}_1 = d^* \overline{Z}_{1Fd}^* \overline{I}_1 + \overline{Z}_F^* \overline{I}_{1F},$$

and the second equation is:

$$\overline{U}_1 = v^* \overline{Z}_{1Fd}^* \overline{I}_1 + (d-v)^* \overline{Z}_{1Fd}^* \overline{I}_{1F} + \overline{Z}_F^* \overline{I}_{1F}$$

where
d=per unit fault distance from the measuring point to the fault point
$\overline{U}_1$=Positive sequence component voltage measured at the measuring point
$\overline{Z}_{1Fd}$=Positive sequence impedance of the electric line per phase
$\overline{Z}_F$=Fault impedance per phase
$\overline{I}_1$=Positive sequence component current measured at the measuring point
$\overline{I}_{1F}$=Positive sequence fault component current at the fault point
v=per unit distance of an equivalent load indicating a distance of the equivalent load point from the measuring point.

4. The method of claim 1, wherein the selection of one of the determined two estimate values as the distance d between the measuring point and the point of fault is performed according to the following criteria:
    If 0<de1<v, then d=de1, else d=de2
    where
    de1=the first estimate value for the distance between the measuring point and the point of fault determined on the basis of the first equation
    de2=the second estimate value for the distance between the measuring point and the point of fault determined on the basis of the second equation
    v=per unit distance of an equivalent load indicating a distance of the equivalent load point from the measuring point.

5. The method of claim 2, wherein $\overline{I}_{1F}$ and/or $\overline{I}_{2F}$ are determined as follows:

$$\overline{I}_{1F} = \overline{I}_1 - k\overline{I}_{1prefault}$$

$$\overline{I}_{2F} = \overline{I}_2 - k\overline{I}_{2prefault}$$

where
$\overline{I}_{1prefault}$=pre-fault positive sequence current component
$\overline{I}_{2prefault}$=pre-fault negative sequence current component
k=load current reduction factor.

6. The method of claim 5, wherein the load current reduction factor k is determined as follows:

where $k = \dfrac{\sum iload_n(\text{fault})}{\sum iload_n(\text{pre-fault})}$ $iload_n$(fault)=load current component of load tap n during fault $iload_n$(pre-fault)=pre-fault load current component of load tap n.

7. The method of claim 2, wherein the distance of the equivalent load is determined on the basis of a load current during the fault on the three-phase electric line.

8. The method of claim 2, wherein the distance of the equivalent load is determined on the basis of a load current during a healthy state of the three-phase electric line.

9. A computer program product comprising computer program code embodied on a non-transitory computer readable medium, wherein the execution of the program code in a computer causes the computer to carry out a method for determining a distance of a phase-to-phase fault or a three-phase fault on a three-phase electric line of an electric network, the method comprising:

monitoring current and voltage quantities of the three-phase electric line at a measuring point;

detecting a phase-to-phase fault or a three-phase fault on the three-phase electric line;

determining a first estimate value for a distance between the measuring point and a point of the detected phase-to-phase fault or three-phase fault on the basis of values of the monitored current and voltage quantities and a first equation which relates the current and voltage quantities to the distance and is based on a fault loop model of the electric line, in which model the point of fault is located between the measuring point and an equivalent load point, which equivalent load point equals to a total load of the electric line modeled to be concentrated in a single point of the electric line;

determining a second estimate value for the distance between the measuring point and the point of the detected phase-to-phase fault or three-phase fault on the basis of values of the monitored current and voltage quantities and a second equation which relates the current and voltage quantities to the distance and is based on a fault loop model of the electric line, in which model the equivalent load point is located between the measuring point and the point of fault; and selecting according to predetermined criteria one of the determined two estimate values as the distance between the measuring point and the point of fault.

10. A fault distance determination apparatus, the apparatus comprising:

means for monitoring current and voltage quantities of a three-phase electric line at a measuring point;

means for determining, in response to a phase-to-phase fault or a three-phase fault occurring on the three-phase electric line:

a first estimate value for a distance between the measuring point and a point of the phase-to-phase fault or the three-phase fault on the basis of values of the monitored current and voltage quantities and a first equation which relates the current and voltage quantities to the distance and is based on a fault loop model of the electric line, in which model the point of fault is located between the measuring point and an equivalent load point, which equivalent load point equals to a total load of the electric line modeled to be concentrated in a single point of the electric line; and a second estimate value for the distance between the measuring point and the point of the phase-to-phase fault or the three-phase fault on the basis of values of the monitored current and voltage quantities and a second equation which relates the current and voltage quantities to the distance and is based on a fault loop model of the electric line, in which model the equivalent load point is located between the measuring point and the point of fault; and means for selecting according to predetermined criteria one of the determined two estimate values as the distance between the measuring point and the point of fault.

11. The apparatus of claim 10, wherein, when the fault is a phase-to-phase fault, the first equation is:

$$\overline{U}_1 - \overline{U}_2 = d*\overline{Z}_{1Fd}*\overline{I}_1 + \overline{Z}_F/2*\overline{I}_{1F} - d*\overline{Z}_{2Fd}*\overline{I}_2 - \overline{Z}_F/2*\overline{I}_{2F},$$

and the second equation is:

$$\overline{U}_1 - \overline{U}_2 = v*\overline{Z}_{1Fd}*\overline{I}_1 + (d-v)*\overline{Z}_{1Fd}*\overline{I}_{1F} + \overline{Z}_F/2*\overline{I}_{1F}$$
$$- v*\overline{Z}_{2Fd}*\overline{I}_2 - (d-v)*\overline{Z}_{2Fd}*\overline{I}_{2F} - \overline{Z}_F/2*\overline{I}_{2F},$$

where d=per unit fault distance from the measuring point to the fault point $\overline{U}_1$=Positive sequence component voltage measured at the measuring point $\overline{U}_2$=Negative sequence component voltage measured at the measuring point $\overline{Z}_{1Fd}$=Positive sequence impedance of the electric line per phase $\overline{Z}_{2Fd}$=Negative sequence impedance of the electric line per phase $\overline{Z}_F$=Fault impedance between the phases $\overline{I}_1$=Positive sequence component current measured at the measuring point $\overline{I}_2$=Negative sequence component current measured at the measuring point $\overline{I}_{1F}$=Positive sequence fault component current at the fault point $\overline{I}_{2F}$=Negative sequence fault component current at the fault point v=per unit distance of an equivalent load indicating a distance of the equivalent load point from the measuring point.

12. The apparatus of claim 10, wherein, when the fault is a three-phase fault, the first equation is:

$$\overline{U}_1 = d*\overline{Z}_{1Fd}*\overline{I}_1 + \overline{Z}_F*\overline{I}_{1F},$$

and the second equation is:

$$\overline{U}_1 = v*\overline{Z}_{1Fd}*\overline{I}_1 + (d-v)*\overline{Z}_{1Fd}*\overline{I}_{1F} + \overline{Z}_F*\overline{I}_{1F}$$

where d=per unit fault distance from the measuring point to the fault point $\overline{U}_1$=Positive sequence component voltage measured at the measuring point $\overline{Z}_{1Fd}$=Positive sequence impedance of the electric line per phase $\overline{Z}_F$=Fault impedance per phase $\overline{I}_1$=Positive sequence component current measured at the measuring point $\overline{I}_{1F}$=Positive sequence fault component current at the fault point v=per unit distance of an equivalent load indicating a distance of the equivalent load point from the measuring point.

13. The apparatus of claim 10, wherein the means for selecting are to select one of the determined two estimate values as the distance d between the measuring point and the point of fault according to the following criteria:

If 0<de1<v, then d=de1, else d=de2 where de1=the first estimate value for the distance between the measuring point and the point of fault determined on the basis of the first equation de2=the second estimate value for the distance between the measuring point and the point of fault determined on the basis of the second equation v=per unit distance of an equivalent load indicating a distance of the equivalent load point from the measuring point.

14. The apparatus of claim 11, wherein the means for determining are to determine $\overline{I}_{1F}$ and/or $\overline{I}_{2F}$ as follows:

$$\overline{I}_{1F} = \overline{I}_1 - k\overline{I}_{1prefault}$$

$$\overline{I}_{2F} = \overline{I}_2 - k\overline{I}_{2prefault}$$

where $\overline{I}_{1prefault}$=pre-fault positive sequence current component
$\overline{I}_{2prefault}$=pre-fault negative sequence current component
k=load current reduction factor.

15. The apparatus of claim 14, wherein the means for determining are to determine the load current reduction factor k as follows:

$$\text{where } k = \frac{\sum iload_n(\text{fault})}{\sum iload_n(\text{pre-fault})}$$

$iload_n$(fault)=load current component of load tap n during fault
$iload_n$(pre-fault)=pre-fault load current component of load tap n.

16. The apparatus of claim 11, wherein the means for determining are to determine the distance of the equivalent load on the basis of a load current during the fault on the three-phase electric line.

17. The apparatus of claim 11, wherein the means for determining are to determine the distance of the equivalent load on the basis of a load current during a healthy state of the three-phase electric line.

18. The apparatus of claim 11, wherein the apparatus comprises a protective relay.

19. A fault distance determination apparatus, the apparatus comprising:

a monitoring unit to monitor current and voltage quantities of a three-phase electric line at a measuring point;

a determining unit to determine, in response to a phase-to-phase fault or a three-phase fault occurring on the three-phase electric line:

a first estimate value for a distance between the measuring point and a point of the phase-to-phase fault or the three-phase fault on the basis of values of the monitored current and voltage quantities and a first equation which relates the current and voltage quantities to the distance and is based on a fault loop model of the electric line, in which model the point of fault is located between the measuring point and an equivalent load point, which equivalent load point equals to a total load of the electric line modeled to be concentrated in a single point of the electric line; and a second estimate value for the distance between the measuring point and the point phase-to-phase fault on the basis of values of the monitored current and voltage quantities and a second equation which relates the current and voltage quantities to the distance and is based on a fault loop model of the electric line, in which model the equivalent load point is located between the measuring point and the point of fault; and a selecting unit to select according to predetermined criteria one of the determined two estimate values as the distance between the measuring point and the point of fault.

* * * * *